United States Patent [19]

Fujishima et al.

[11] Patent Number: 5,591,657
[45] Date of Patent: Jan. 7, 1997

[54] SEMICONDUCTOR APPARATUS MANUFACTURING METHOD EMPLOYING GATE SIDE WALL SELF-ALIGNING FOR MASKING

[75] Inventors: Naoto Fujishima; Yoshihiko Nagayasu; Akio Kitamura, all of Nagano, Japan

[73] Assignee: Fuji Electric Co., Ltd., Kawasaki, Japan

[21] Appl. No.: 329,943

[22] Filed: Oct. 26, 1994

[30] Foreign Application Priority Data

Oct. 26, 1993 [JP] Japan .................................. 5-266761
May 25, 1994 [JP] Japan .................................. 6-110621

[51] Int. Cl.$^6$ .................... H01L 21/265; H01L 21/70; H01L 27/00
[52] U.S. Cl. .................... 437/41; 437/31; 437/57
[58] Field of Search .................... 437/31, 41, 40 DM, 437/41 DM, 43, 44, 57, 45, 41 KBP; 257/341, 339

[56] References Cited

U.S. PATENT DOCUMENTS

| | | |
|---|---|---|
| 4,104,784 | 8/1978 | Klein ................................. 437/45 |
| 4,217,688 | 8/1980 | Ipri .................................... 437/31 |
| 4,503,598 | 3/1985 | Vora et al. ......................... 257/341 |
| 4,716,126 | 12/1987 | Cogan ............................... 437/41 |
| 4,967,244 | 10/1990 | Bauer ................................ 257/341 |
| 5,072,267 | 12/1991 | Hattori .............................. 257/339 |

FOREIGN PATENT DOCUMENTS 3-159173  7/1991  Japan .
3-244135  10/1991  Japan .
5-136359  6/1993  Japan .

OTHER PUBLICATIONS

IEEE IEDM 88, pp. 796–799 (1988), Dolny et al. "Complementary DMOS/BiCMOS technology for power IC applications".
IEEE J. Solid–State Circuit, vol. SC–16, pp. 212–226, Jun. 1981.
Proceedings of 1992 International Symposium on Power Semiconductor Devices & ICs, Tokyo, pp. 52–57.

*Primary Examiner*—George Fourson
*Assistant Examiner*—Brian K. Dutton
*Attorney, Agent, or Firm*—Rossi & Associates

[57] ABSTRACT

The invention increases withstand voltage and current capacity of a DMOS portion simultaneously built in by the BiCMOS process. The manufacturing method for the DMOS portion is comprised of steps of forming an ion-implanted layer in a surface of a P-type well; forming a gate electrode; self-aligning a P-type base region by employing the P-type base formation process of the bipolar transistor and by using the gate electrode as a mask; forming a side wall on a side face of the gate electrode by employing the process for forming the LDD structure of the CMOS; and self-aligning an N+type source region by employing the process for forming the N+type source and the drain of the CMOS and by using the side wall as a mask. The effective channel length becomes longer by the side wall length and the rate of heavily doped channel portion to the total channel length becomes high. The manufacturing method effectively suppresses surface punch through by the high rate of the heavily doped channel portion and facilitates increasing withstand voltage and current capacity of the DMOS portion even when the total acceptor amount in the ion-implanted layer is insufficient.

24 Claims, 12 Drawing Sheets

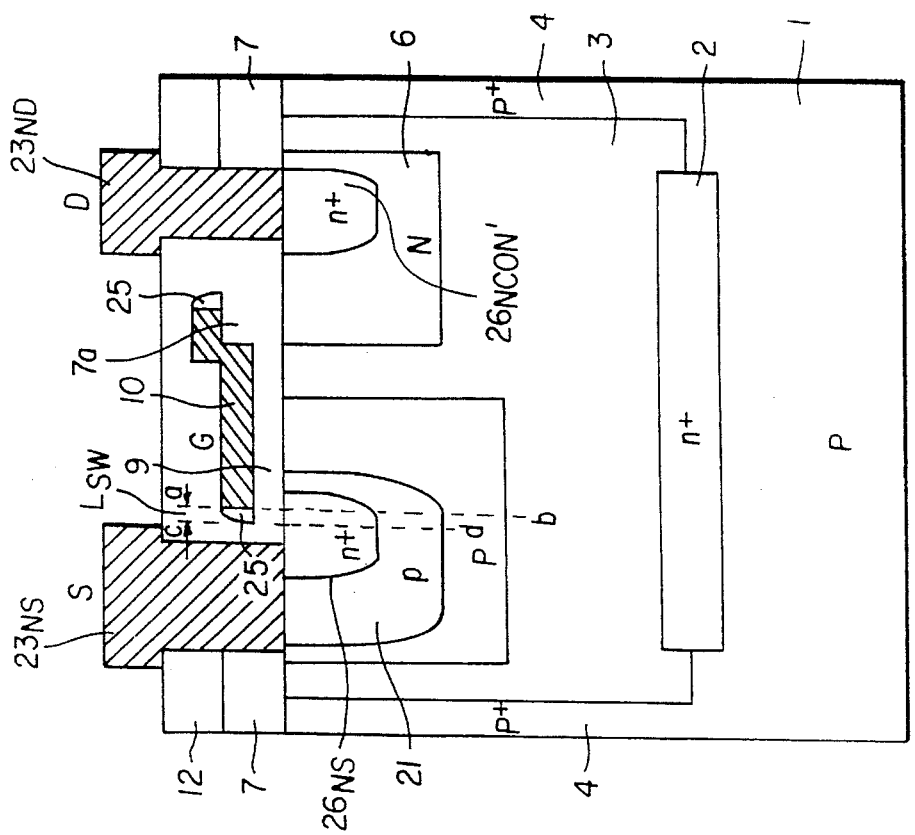
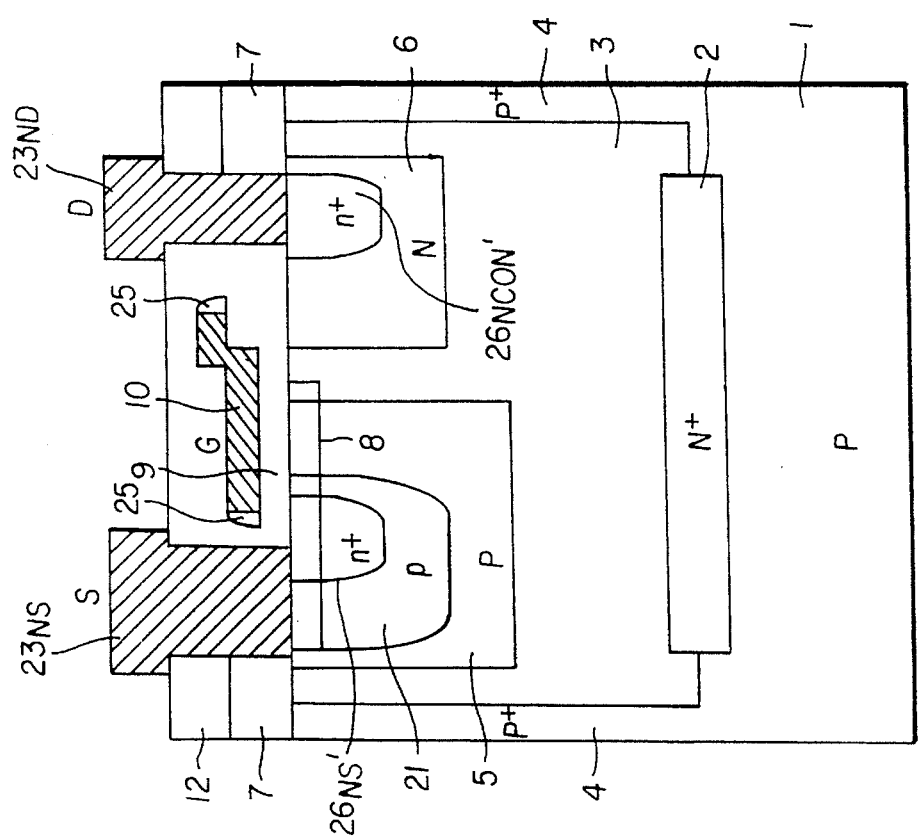
FIG. 5
FIG. 4

5,591,657

SEMICONDUCTOR APPARATUS MANUFACTURING METHOD EMPLOYING GATE SIDE WALL SELF-ALIGNING FOR MASKING

FIELD OF THE INVENTION

The present invention relates to a low withstand voltage BiCMOS processing technique for mounting a power DMOS transistor, a bipolar transistor and a CMOS transistor on a common chip (i.e. same base plate) and, more specifically, the present invention relates to a manufacturing method for the power DMOS transistor.

BACKGROUND OF THE INVENTION

A typical CMOS portion (a complementary insulated-gate field effect transistor) of a BiCMOS semiconductor apparatus which has a double-well (twin-tub) structure is shown in FIG. 18. The CMOS portion is comprised of an N+-type buried layer 2 formed on a P-type substrate 1; an N-type epitaxial layer 3 grown over the buried layer 2; an isolated element island isolated by a P+-type isolation layer 4 which reaches the P-type substrate 1; and double wells (a P-type well 5 and an N-type well 6) formed in the isolated element island by ion-implantation and subsequent diffusion. A CMOS transistor is formed in the CMOS portion after the double-well formation. An active region is first covered, for example, by a nitride film, and then an element-isolating insulative film (local oxidation film: LOCOS) 7 is formed on the P+-type isolation layer 4 and the non-well portions between the P- and N-type wells 5 and 6 by selectively oxidizing the nitride film 7. An ion-implanted layer 8 is formed by implanting acceptor type (P-type) impurities, such as $BF_2$, shallowly from the major faces of the wells 5 and 6. Poly-silicon gate electrodes 10 are then formed on the gate insulation film 9 deposited on the wells 5 and 6. An N+-type source region $11_{NS}$ and an N+-type drain region $11_{ND}$ are formed by self-alignment using the gate electrode 10 on the P-type well 5 as a mask. Through this step, an N+-type well-contact region $11_{NCON}$ is formed simultaneously on the source side in the N-type Well 6. A P+-type source region $11_{PS}$ and a P+-type drain region $11_{PD}$ are then formed by the self-alignment technique using the gate electrode 10 on the N-type well 6 as a mask. Through this step, a P+-type well-contact region $11_{PCON}$ is formed simultaneously on the source side in the P-type well 5. An inter-layer insulation film 12 is subsequently formed. Finally, source electrodes $13_{NS}$, $13_{PS}$ and drain electrodes $13_{ND}$, $13_{PD}$, which fill contact holes punched through the insulation film 12, are deposited.

FIGS. 19 and 20 show structures of a high-withstand voltage DMOS portion (double-diffusion type insulated gate field effect transistor) as a power MOS portion of the BiCMOS semiconductor apparatus. A P-type well 5 and an N-type well 6 of the N-channel type DMOSFET shown in FIG. 19 are formed through similar processes to those described above for the CMOS portion. The N-type well 6 constitutes an offset region which functions as an expanded drain for reducing the ON-resistance of the MOSFET.

An active region is covered, for example, by a nitride film, and then an element-isolating insulative film (local oxidation film: LOCOS) 7 is formed over the P+-type isolation layer 4 and thick local oxidation film 7a on the P-type well side on the N-type well 6 by selectively oxidizing the nitride film. An ion-implanted layer 8 is formed by implanting acceptor type (P-type) impurities, such as $BF_2$, shallowly from a major face of the P-type well 5. A gate electrode 10 is formed on gate insulation film 9 deposited on the P-type wells 5. A P-type base region (channel diffusion region) 21 is self-aligned in the P-type well 5 more deeply than the diffusion depth of the ion-implanted layer 8 by employing a process for forming a P-type base region of a bipolar transistor (NPN transistor) described later and by using the gate electrode 10 as a mask. An N+-type source region $22_{NS}$ is then formed from a major face side of the P-type base region 21 by employing the process for forming the N+-drain and source of the CMOS portion and by double diffusion using the gate electrode 10 as a mask, and an N+-type well-contact (drain) region $22_{NCON}$ from a major face of the N-type well 6. An inter-layer insulation film 12 is formed. Finally, a source electrode $23_{NS}$ and a drain electrode $23_{ND}$, which fill contact holes punched through the insulation film 12, are deposited. The thick local oxidation film 7a contributes to the provision of a higher withstand voltage by relaxing the electric field convergence onto the edge of the drain.

A P-type well 5 and an N-type well 6 of the P-channel type DMOSFET of the DMOS portion shown in FIG. 20 are formed through similar processes to those for the CMOS portion and the P-type well 5 constitutes an offset region which functions as an expanded drain for reducing ON-resistance of the MOSFET. At first, an active region is covered, for example, by a nitride film, and then element-isolating insulative film 7 is formed on the P+-type isolation layer 4 and thick local oxidation film 7a on the N-type well side on the P-type well 5 by selectively oxidizing the nitride film. An ion-implanted layer 8 is formed by implanting acceptor type (P-type) impurities, such as $BF_2$, shallowly from a major face of the N-type well 6. A gate electrode 10 is formed on the gate insulation film 9 deposited on the N-type wells 6. A P+-type source region $22_{PS}$ is self-aligned in the N-type well 6 on from its major face more deeply than the diffusion depth of the ion-implanted layer 8 by employing the process for forming the P+-type source and drain of the CMOS portion and by using the gate electrode 10 as a mask, and P+-type well-contact region $22_{PCON}$ in the P-type well 5. Inter-layer insulation film 12 is then formed. Finally, a source electrode $23_{PS}$ and a drain electrode $23_{PD}$ which fill contact holes punched through the insulation film 12 are deposited. The thick local oxidation film 7a contributes to provision of higher withstand voltage by relaxing the electric field convergence onto the edge of the drain.

The bipolar transistor portion of the BiCMOS semiconductor apparatus is comprised of a vertical NPN transistor and a transverse PNP transistor as shown in FIG. 21. The bipolar transistor portion is formed through processing steps similar to those for forming the CMOS portion as follows. At first, an N+-type buried layer 2 is formed on a P-type substrate 1. An N-type epitaxial layer 3 is grown over the buried layer 2, and a P+-type element isolation layer 4, which reaches the substrate 1, is then formed to isolate an element island. In fabricating the vertical NPN transistor, a P-type base region $31_{PB}$ is formed in the N-type epitaxial layer 3. An N+-type emitter region $32_{NE}$ and an N+-type collector region (collector-contact region) $32_{NC}$ are then formed by employing the process for forming the N+-type source and drain of the CMOS portion. After forming inter-layer insulation film 12, a base electrode $33_B$, an emitter electrode $33_E$, and a collector electrode $33_C$, which fill contact holes punched through the insulation film 12, are formed. In fabricating the transverse PNP transistor, a P-type emitter region $31_{PE}$ and a P-type collector region $31_{PC}$ are formed in the N-type epitaxial layer 3 by employing the process for forming the P-type base region $31_{PB}$ of the vertical transistor. A N+-type base region (base-contact) $32_{NB}$ is then formed by employing the process for forming the N+-type source and drain of the CMOS portion. After forming inter-layer insulation film 12, a base electrode $34_B$, an emitter electrode $34_E$, and a collector electrode $34_C$, which fill contact holes punched through the insulation film 12, are formed.

The N-channel DMOSFET with double-well structure shown in FIG. 19, which functions as the power DMOS portion, may be constructed in a DMOS structure shown in FIG. 22 from which the P-type well 5 and the ion-implanted layer 8 are eliminated. In fabricating the N-channel DMOSFET of FIG. 22, an N+-type buried layer 2 is formed on a P-type substrate 1. An N-type epitaxial layer 3 is grown over the buried layer 2. A P+-type element isolation layer 4, which reaches the substrate 1, is then formed to isolate an element island. An N-type well 6 is formed in the isolated element island by ion-implantation and subsequent diffusion. The N-type well 6 functions as an offset region as an expanded drain for reducing ON-resistance of the MOSFET. An active region is covered, for example, by nitride film, and element-isolating insulative film 7 is then formed on the P+-type isolation layer 4 and thick local oxidation film 7a is formed on the edge portion of the N-type well 6 by selectively oxidizing the nitride film. A gate electrode 10 is formed on gate insulation film 9 deposited on the N-type epitaxial layer 3. A P-type base region (channel diffusion region) 21 is then formed, as described earlier, by employing the process for forming the P-type base of the bipolar transistor (NPN transistor), by implanting impurity ions from a major face of the N-type epitaxial layer 3 by the self-alignment technique using the gate electrode 10 as a mask, and by subsequent heat treatment between 1000° and 1200° C. An N+-type source region $22_{NS}$ is then formed from a major face of the P-type base region 21 by employing the process for forming the N+-type drain and source of the CMOS portion, and by ion-implantation using the gate electrode 10 as a mask followed by subsequent double diffusion. At the same time, an N+-type well-contact region $22_{Ncon}$ is formed from a major face of the N-type well 6. After depositing inter-layer insulation film 12, a source $23_{NS}$ and a drain electrode $23_{ND}$, which fill contact holes punched through the insulation film 12, are then formed. Finally, a passivation film is deposited. The thick local oxidation film 7a contributes to provision of higher withstand voltage by relaxing electric field convergence onto the edge of the drain.

The BiCMOS structure according to the prior art which is comprised of the above described DMOS portion as the power MOS portion has a number of deficiencies. For example, in the high-withstand voltage DMOS portions shown in FIGS. 19 and 20, the ion-implanted layers 8 are formed by employing the ion-implantation process for forming the ion-implanted layer of the low-withstand voltage CMOS. Since ion-implantation process exclusive for forming an ion-implanted layer of the DMOS portions is not employed, the P-type ion-implanted layers 8, especially that of the N-channel MOSFET shown in FIG. 19, tends to be subject to an insufficient withstand voltage caused by surface punch through because of a deficit in the amount of total acceptors. Elongated channel length for avoiding this problem increases ON-resistance, which is hazardous for increasing current capacity. Withstand voltage increase and ON-resistance decrease are therefore in a trade-off relation to each other.

In the DMOS structure shown in FIG. 22, the P-type base region 21 is formed by ion-implantation from the major face of the N-type epitaxial layer 3 using the gate electrode 10 as a mask for self-alignment and by heat treatment at a high temperature for a long period of time. Therefore, the process for forming the P-type base region 21 of FIG. 22 requires an increase in the number of processing steps. Moreover, since impurities diffuse from the gate electrode 10 into the gate insulation film 9 and the channel portion in the surface of the P-type base region 21 during the heat treatment, the impurity concentration distribution (acceptor in N-type MOS and donner in P-type MOS) cannot be accurately controlled. This further causes an unstable threshold voltage and difficulty in securing a withstand voltage because of a deteriorated reliability of the gate insulation film 9. In addition, since the too deep diffusion depth of the P-type base region 21, formed by the heat treatment at high temperature for long period of time causes elongated effective channel length of the MOSFET, i.e. channel resistance (ON-resistance) increase, current capacity increase is hindered.

Though the diffusion is confined within a shallow depth when the heat treatment at high temperature for a long period of time is not applied, the dose amount of implanted impurity should be increased instead, which causes increased crystal defects in the channel portion which further causes deterioration of yield of the non-defective element, especially of a large area. Since a PN junction between the P-type base region and 21 and the N+ type source region $22_{NS}$ is formed in the channel surface region in which the transverse impurity concentration gradient in the P-type base region is large, dispersion of the N+ diffusion depth causes dispersion of surface concentration in the P-type base region, which further causes dispersion of the threshold voltage.

In view of the foregoing, a first object of the present invention is to provide a manufacturing method which facilitates increasing the withstand voltage and current capacity of a DMOS portion of a BiCMOS semiconductor apparatus. A second object of the present invention is to provide a manufacturing method which facilitates eliminating processes exclusive for forming the DMOS portion and forms the DMOS portion solely through the BiCMOS processing steps. A third object of the present invention is to provide a manufacturing method which facilitates suppressing crystal defect formation in the channel portion and forming the highly reliable DMOS portion. A fourth object of the present invention is to provide a manufacturing method which facilitates suppressing dispersion in the characteristics of the pertinent portions which affect the threshold voltage of the DMOS portion. Other objects and advantages will become apparent from the following detailed discussion of the preferred embodiments of the invention.

SUMMARY OF THE INVENTION

The objects of the present invention are achieved by securing a transverse diffusion length difference between pertinent regions in a DMOS portion by forming side walls (or spacers) on both side faces of a gate electrode and by subsequently forming a source region using the side walls as a mask for self-alignment.

More specifically, the objects of the present invention are achieved by a manufacturing method for a semiconductor apparatus, which includes a DMOS transistor with a channel of a first conduction type, comprised of the steps of forming a gate electrode on gate insulation film deposited on a major face of a semiconductor region of the first conduction type; forming a base region of a second conduction type from the major face of the semiconductor region of the first conduction type by using the gate electrode as a mask for self-alignment; and forming a source region of the first conduction type from a major face of the base region of the second conduction type, in which the step of forming the source region is further comprised of a step of self-aligning the source region of the first conduction type by using a side wall formed on a side face of the gate electrode as a mask. The base region of the second conduction type may be formed after forming a well of the second conduction type in the semiconductor region of the first conduction type, or after forming an ion-implanted layer of the second conduction type.

The source region of the first conduction type, which may be formed through an exclusive process for forming the DMOS, is formed through a following process when the semiconductor apparatus is comprised of a BiCMOS semiconductor apparatus further comprised of a CMOS transistor and a bipolar transistor formed on a common substrate. That is, by adopting a formation method of the LDD structure having side walls on both side faces of the DMOS transistor for forming the CMOS transistor, the side wall formation process of the CMOS transistor is employed for forming the side walls of the DMOS transistor. Further, the base region of the second conduction type is formed by employing a process for forming a base region of the second conduction type of the bipolar transistor. Moreover, the source region of the first conduction type of the DMOS transistor is formed by employing a process for forming a source and a drain of the first conduction type of the CMOS transistor.

The objects of the present invention are also achieved by a manufacturing method for a semiconductor apparatus, which includes a DMOS transistor with a channel of the second conduction type, comprised of the steps of forming a well of the first conduction type in a semiconductor region of the first conduction type; forming an ion-implanted layer by ion-implanting impurities of the second conduction type from a major face of the well of the first conduction type; forming a gate electrode on gate insulation film deposited on a major face of the ion-implanted layer; and forming a source region of the second conduction from a major face of the well type more deeply than diffusion depth of the ion-implanted layer, in which the step of forming the source region is further comprised of a step of self-aligning the source region of the second conduction type by using a side wall formed on a side face of the gate electrode as a mask. In this manufacturing method, the side wall formation process of the CMOS transistor is employed for forming the side walls of the DMOS transistor. Further, the source region of the second conduction type of the DMOS transistor is formed by employing a process for forming a source and a drain of the second conduction type of the CMOS transistor.

The manufacturing method for the DMOS transistor with a channel of the first conduction type, which forms the base region of the second conduction type from the major face of the semiconductor region of the first conduction type by a self-alignment technique using the gate electrode as a mask and forms the source region of the first conduction type from the major face of the base region by a self-alignment technique using the side wall formed on a side face of the gate electrode as a mask, suppresses the transverse diffusion of the source region by the width of the side wall and elongates the effective channel length by the width of the side wall. Therefore, the withstand voltage is improved, since a considerable portion of the total impurity amount of the base region remains in the channel portion as its total impurity amount. If the high temperature heat treatment for driving the base region of the second conduction type is eliminated from the above described process, the effective channel length can successfully be shortened by compensating the channel length elongation by the side wall with the channel length decrease by the elimination of high temperature heat treatment. Thus, the channel resistance decreases and the current capacity increases are facilitated. As described above, since the high temperature heat treatment for driving the base region can be eliminated, the number of processing steps is decreased and impurity diffusion from the gate electrode is prevented, by which reliability of the gate insulation film is improved and the threshold voltage is stabilized. In addition, since the dose amount of the impurities in the P-type base region can be decreased, crystal defects are decreased, which results in improved reliability. Moreover, dispersion of the surface concentration of the P-type base region is decreased and dispersion of the threshold voltage is suppressed.

Though the well of the second conduction type is formed in advance to the formation of the base region of the same conduction type in the manufacturing method of the DMOS transistor with a channel of the first conduction type which forms the base region of the second conduction type from the major face of the well of the second conduction formed in the semiconductor region of the first conduction type by a self-alignment technique using the gate electrode as a mask and forms the source region of the first conduction type from the major face of the base region by a self-alignment technique using the side wall formed on a side face of the gate electrode as a mask, this manufacturing method provides with the similar functions and effects as those of the aforementioned manufacturing method.

The manufacturing method for the DMOS transistor with a channel of the first conduction type, which forms the base region of the second conduction type deeper than the ion-implanted layer of the second conduction type by a self-alignment technique using the gate electrode as a mask and forms the source region of the first conduction type from the major face of the base region by a self-alignment technique using the side wall formed on a side face of the gate electrode as a mask, forms the source region without eroding the base region by the width of the side wall. Thus, the channel length is elongated in the base region and ratio of the high impurity concentration portion in the total channel portion is increased correspondingly. Therefore, surface punch through is effectively prevented and a higher withstand voltage is realized, since the ratio of the high impurity concentration portion is elongated in the base region of the second conduction type even when the total amount of the implanted impurity of the second conduction type is not sufficient. Since the channel length can be easily shortened as described earlier, current capacity can be decreased by reducing channel resistance. This manufacturing method provides the similar functions and effects as those of the aforementioned manufacturing methods.

Though the well and the ion-implanted layer of the second conduction type are formed in advance to the formation of the base region of the same conduction type in the manufacturing method of the DMOS transistor with a channel of the first conduction type which forms the base region of the second conduction type more deeply than the diffusion depth of the ion-implanted layer by a self-alignment technique using the gate electrode as a mask and forms the source region of the first conduction type from the major face of the base region by a self-alignment technique using the side wall formed on a side face of the gate electrode as a mask, this manufacturing method provides with the similar functions and effects as those of the aforementioned manufacturing methods.

When the semiconductor apparatus is a BiCMOS semiconductor apparatus, the number of processing steps is decreased by adopting the LDD structure for the CMOS portion and by employing the side wall formation process of the CMOS transistor for forming the side wall in the DMOS portion. The CMOS portion and the DMOS portion can be integrated into a monolithic circuit, and in addition, reliability of the constituent elements is improved since hot carrier injection into the gate insulation film in the CMOS portion can be suppressed. Moreover, in addition to decrease of the processing steps by the employment of the process of base region formation in the bipolar transistor for forming the base region of the second conduction type of the DMOS portion, the impurity concentration in the base region of the DMOS portion can be lowered and the current amplification factor $h_{FE}$ of the bipolar transistor can be increased, since the masking side wall prevents transverse diffusion of the source region of the first conduction type from eroding the base region of the second conduction type. Moreover, the number of processing steps is further decreased by employing the formation process of the source and the drain of the first conduction type of the CMOS transistor for forming the source region of the first conduction type of the DMOS transistor.

The manufacturing method of the semiconductor apparatus which includes a DMOS transistor with a channel of the second conduction type according to the present invention facilitates preventing withstand voltage lowering caused by surface punch through and facilitates increasing current capacity, since the transverse diffusion length of the source region is shortened by the width of the side wall used as a mask for self-aligning the source region of the second conduction type and since the concentration of the first conduction type impurities in the surface layer of the well of the first conduction type beneath the gate electrode is increased similarly as described above. When the semiconductor apparatus is a BiCMOS semiconductor apparatus the CMOS portion of which has the LDD structure, reliability of the CMOS portion is improved, the current amplification factor hFE of the bipolar transistor is increased and number of processing steps is decreased as described above.

BRIEF DESCRIPTION OF THE DRAWINGS

The present invention will be described in detail hereinafter with reference to the accompanied drawings which illustrate preferred embodiments of the present invention, wherein:

FIG. 4 is a sectional view showing another embodiment structure at source and drain electrode formation of the N-channel DMOSFET of the high withstand voltage DMOS portion of the BiCMOS obtained by another process according to the present invention;

FIG. 5 is a sectional view showing still another embodiment structure at source and drain electrode formation of the N-channel DMOSFET portion of the high withstand voltage DMOS of the BiCMOS obtained by still another process according to the present invention;

FIG. 21 is a sectional view showing a structure at electrode formation of the bipolar transistor of the BiCMOS according to the prior art; and FIG. 22 is a sectional view showing another structure at source and drain electrode formation of the N-channel DMOSFET of the high withstand voltage DMOS portion of the BiCMOS according to the prior art.

DETAILED DESCRIPTION OF THE PREFERRED EMBODIMENTS

Table 1 lists the BiCMOS processing sequence steps, in which an open circle indicates that the designated step is included.

Figure 1:
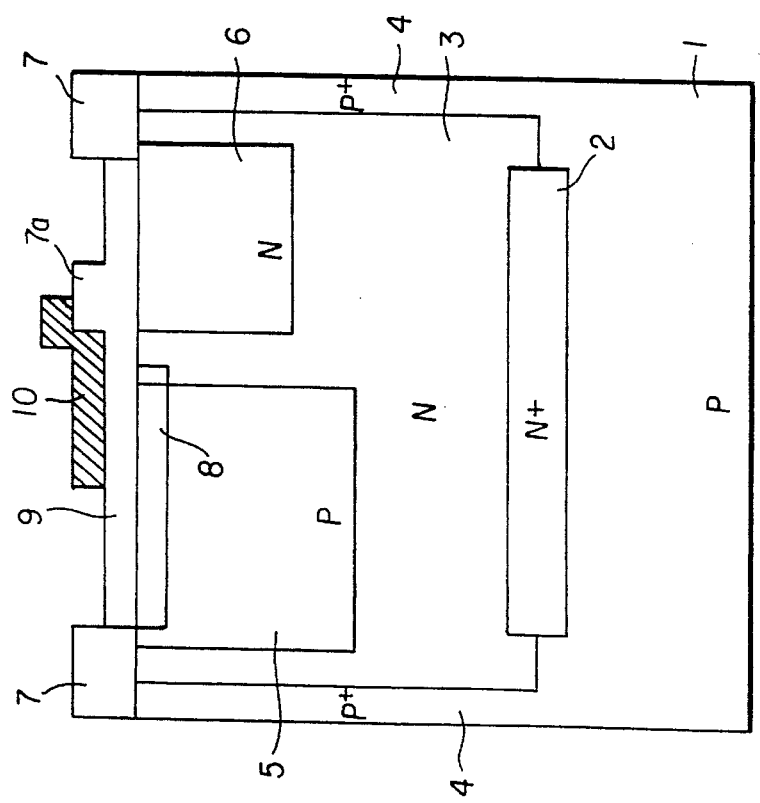
FIG. 1 is a sectional view showing an embodiment structure at gate electrode formation of the N-channel DMOSFET of the high withstand voltage DMOS portion of the BiCMOS according to the present invention.

FIG. 1 is a sectional view showing an embodiment structure at gate electrode formation of the N-channel DMOSFET of the high withstand voltage DMOS portion in the BiCMOS process according to the present invention. In the embodiment of the DMOS portion, as listed in Table 1 and similarly as by the prior art, an N+-type buried layer 2 is formed on a P-type semiconductor substrate 1. An N-type epitaxial layer 3 is grown over the buried layer 2, and a P+-type element isolation layer 4, which reaches the P-type semiconductor substrate 1, is then formed to isolate an element island. A P-type well 5 and an N-type well 6 are formed in the isolated element island through ion-implantation processes for P- and N wells. In some cases, the P-type well 5 is not formed as will be described later. The N-type well 6 functions as an offset region as an expanded drain for reducing ON-resistance of the MOSFET. An active region is covered, for example, by a nitride film, and an element-isolating insulative film (local oxidation film: LOCOS) 7 is then formed on the P+-type isolation layer 4 and thick local oxidation film 7a is formed on the side of the P-type well 5 above the N-type well 6 by selectively oxidizing the nitride film. Then, in the embodiment illustrated, an ion-implanted layer 8 is formed by shallowly implanting impurities of the acceptor type (P-type), such as $BF_2$, from the surface of the P-type well 5. As described later, the ion-implanted layer 8 is not formed in some cases. After forming the ion-implanted layer 8, a gate electrode 10 is formed on gate insulation film 9 and the local oxidation film 7a.

Figure 2:
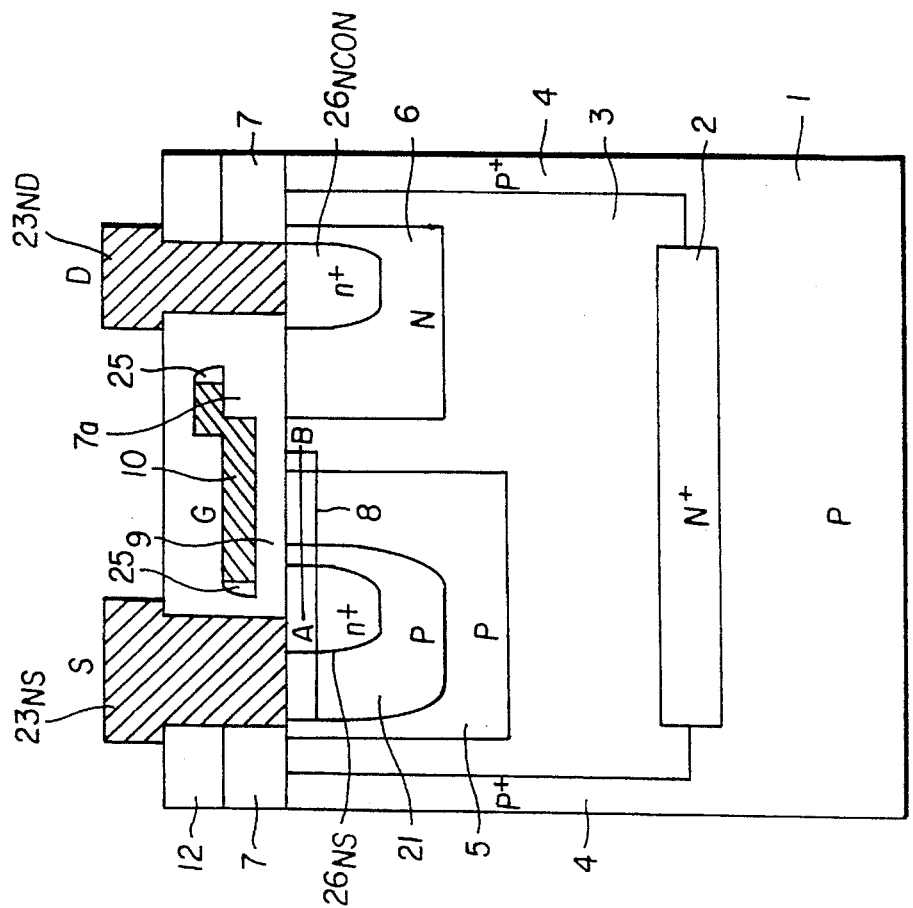
FIG. 2 is a sectional view showing an embodiment structure at source and drain electrode formation of the N-channel DMOSFET of the high withstand voltage DMOS portion of the BiCMOS according to the present invention.

FIG. 2 is a sectional view showing an embodiment structure at source and drain electrode formation of the N-channel DMOSFET of the high withstand voltage DMOS portion in the BiCMOS process according to the present invention. After the gate electrode 10 is formed, a P-type base region (channel diffusion region) 21 is formed in the P-type well 5 more deeply than the diffusion depth of the ion-implanted layer 8 by employing a process for forming a P-type base of the bipolar transistor described later and by using the gate electrode 10 as a mask for self-alignment. After the P-type base region 21 is formed, side walls 25 of, for example, an oxide film deposited by the CVD technique, are formed on the side faces of the gate electrode 10 by an exclusive process or by employing a process for forming an LDD structure for the CMOS portion described later. After the side wall formation, an N+-type source region $26_{NS}$ is formed in the heavily doped P-type base region 21 by double diffusion using the gate electrode 10 and the side wall 25 as a mask for self-alignment, and at the same time, N+-type well-contact region (drain) $26_{NCON}$ is formed in the N-type well 6. After forming inter-layer insulation film 12, contact holes are punched through the insulation film 12, and a source electrode $23_{NS}$ and a drain electrode $23_{ND}$ are formed. A passivation film is then deposited. The thick local oxidation film 7a relaxes electric field convergence onto the edge of the drain and contributes to increasing the withstand voltage.

An N-channel type DMOS (double diffused MOS) structure is formed in the P-type well 5 by transverse diffusion

TABLE 1

| | Process sequence and element devices | | | | | | | | | | | | | | | | |
|---|---|---|---|---|---|---|---|---|---|---|---|---|---|---|---|---|---|
| | Device | | | | | | | | | | | | | | | | |
| | CMOS | | | | NDMOS | | | | | PDMOS | | NPN | | PNP | | | |
| | 8 | | 9 | | | | | | | | | | | | | | |
| Process | Nch | Pch | Nch | Pch | 1 | 2 | 3 | 4 | 5 | 6 | 7 | 10 | 12 | 11 | 13 | 15 | 14 |
| N+ buried layer | O | O | O | O | O | O | O | O | O | O | O | O | O | O | O | O | O |
| P+ element isolation | O | O | O | O | O | O | O | O | O | O | O | O | O | O | O | O | O |
| P well | O | | O | | O | O | | O | | O | O | | | | | | |
| N well | | O | | O | O | O | O | O | O | O | O | | | | | | |
| Selective oxidation | O | O | O | O | O | O | O | O | O | O | O | | | | | | |
| Ion-impla. | O | O | O | O | O | O | | | | O | O | O | | | | | |
| Gate formation | O | O | O | O | O | O | O | O | O | O | O | | | | | | |
| LDD | O | | O | | | | | | | | | | | | | | |
| N source | | | | | | O | | | | | | O | | | O | O | |
| P base | O | O | | | O | O | O | O | O | O | O | O | O | | O | | |
| Side wall formation | O | O | O | O | O | O | O | O | O | O | O | | | | | | |
| N+ source | O | O | O | O | O | | O | O | O | O | O | O | | O | O | | |
| P+ source | | | O | O | | | | | | | O | | O | | O | | O |
| Contact | O | O | O | O | O | O | O | O | O | O | O | O | O | O | O | O | O |
| Metal | O | O | O | O | O | O | O | O | O | O | O | O | O | O | O | O | O | length difference between the P-type base region 21 and N+-type source region $26_{NS}$ as a channel diffusion region. Since the DMOS structure usually facilitates reducing the P-type base resistance beneath the N+-type source region $26_{NS}$, a parasitic bipolar transistor comprised of the P-type base region 21 and the N-type well (drain region) 5 hardly operates, which prevents latching up and facilitates widening the safe operation area. In addition, since the N+-type source region $26_{NS}$ is surrounded by the heavily doped P-type base region 21, punch through between the source and the drain is prevented, and an increase in the withstand voltage is facilitated.

Figure 3A:
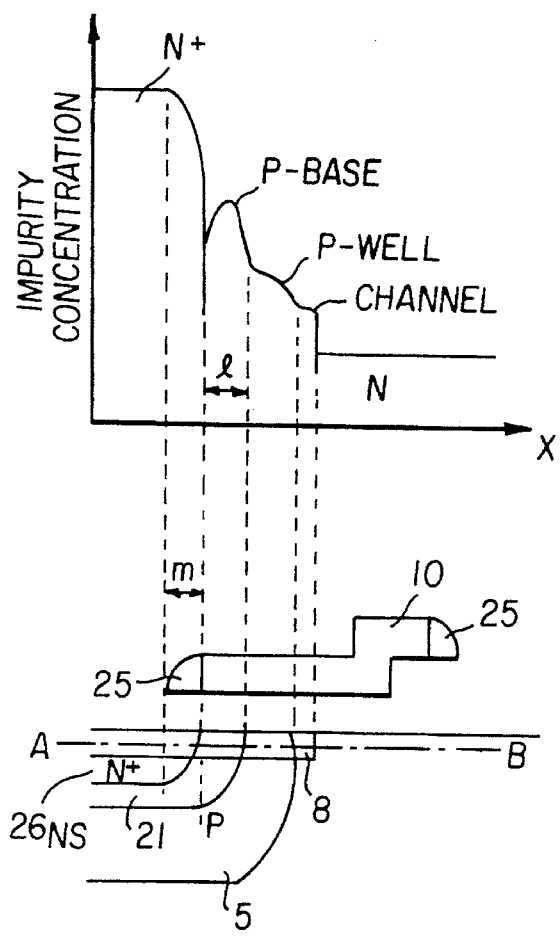
FIG. 3(a) is a graph showing the impurity distribution on a horizontal section including A-B line of FIG. 2
Figure 3B:
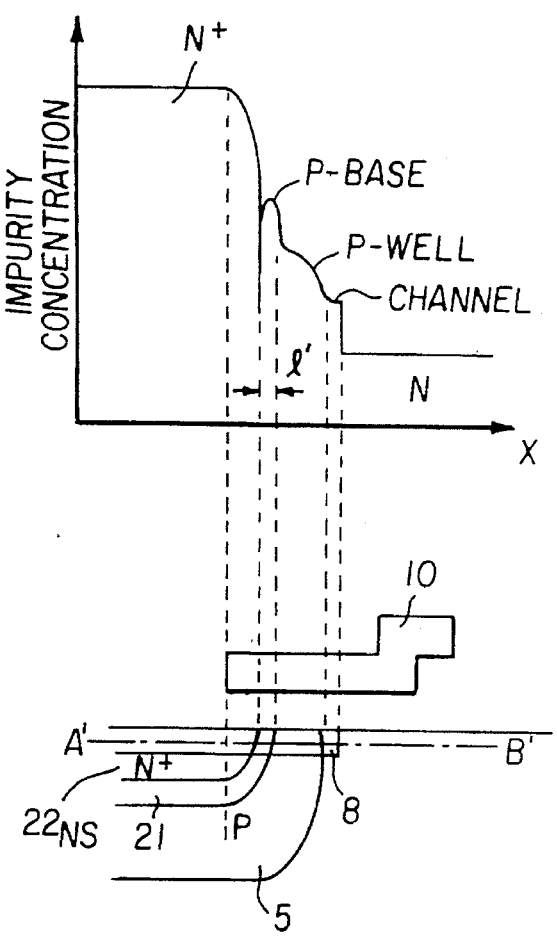
FIG. 3(b) is a graph showing the impurity distribution on a horizontal section including A'-B' line of FIG. 19.
Figure 19:
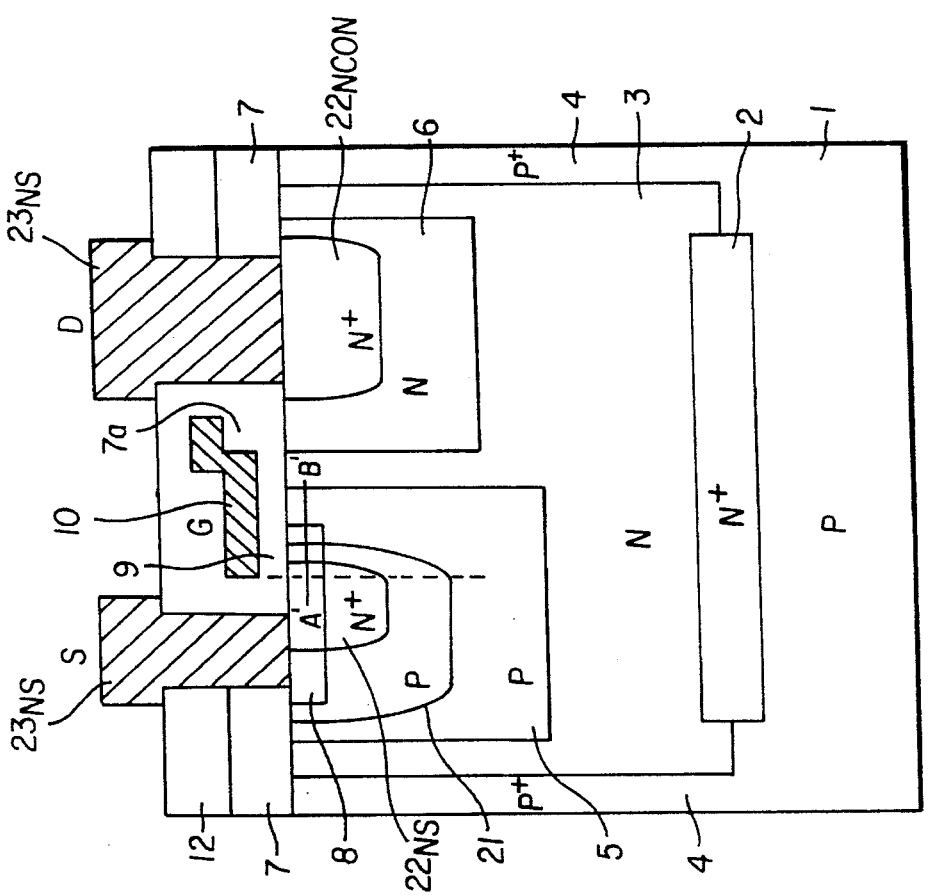
FIG. 19 is a sectional view showing a structure at source and drain electrode formation of the N-channel DMOSFET of the high withstand voltage DMOS portion of the BiCMOS according to the prior art.

Since the side wall 25 for a mask for forming the N+-type source region $26_{NS}$ is formed in advance to the formation of the N+-type source region $26_{NS}$, the impurities distribute along A-B horizontal section of FIG. 2 as shown in FIG. 3(a). FIG. 3(b) shows impurity distribution along A'-B' horizontal section of FIG. 19 of the prior art DMOS portion.

As is illustrated from FIGS. 3(a) and (b), length l of the P-type base region is longer than that of the prior art by width m of the side wall. Therefore, the effective channel length in the heavily doped P-type base region 21 is longer than that of the prior art and the rate of the heavily doped channel portion is increased correspondingly. Even when the total acceptor amount is insufficient in the ion-implanted layer 8 of the N-channel MOSFET formed by employing the CMOS process, since the rate of the heavily doped channel portion is high because of the heavily doped P-type base region, the channel length need not be set longer. Therefore, surface punch through is effectively prevented, and an increase of the withstand voltage and current capacity is facilitated. In the prior art of FIG. 19, which lacks the side wall 25, the impurity concentration in the P-type base region 21 should be increased and its transverse diffusion length should be elongated for obtaining an increased withstand voltage and current capacity. Since the P-type base region 21 is formed by employing the process for forming the P-type base region of the bipolar NPN transistor, the impurity concentration in the P-type base region of the NPN transistor exceeds the optimum concentration and the excess impurity concentration causes lowering of the current amplification factor $h_{FE}$ of the bipolar transistor. However, the present embodiment, which prevents transverse diffusion of the N+-type source region from eroding too much the P-type base region by the side wall mask 25, rather facilitates lowering the impurity concentration in the P-type base region 21, by which an increase of the current amplification factor hFE of the bipolar transistor is further facilitated. The present embodiment employs the process for forming the P-type base region of the bipolar transistor for forming the P-type base region 21, the process for forming the side walls of the LDD structure of the CMOS portion for forming the side wall 25, and the process for forming the N+-type source and drain of the CMOS portion for forming the N+-type source region 26NS, respectively.

However, a process for exclusively forming the N-type source may be inserted in advance to the formation process for the P-type base region 21 as the process sequence 2 of Table 1 describes. That is, as shown in FIG. 4, an N-type source region $26_{NS}'$ is formed in the P-type well 5 by an exclusive process for forming the N-type source of the DMOS using the gate electrode 10 as a mask for self-alignment, and an N-type well-contact region $26_{NCON}'$ in the N-type well 6. The P-type base 21 is then formed by employing the process for forming the P-type base region of the bipolar transistor using the gate electrode 10 as a mask for self-alignment. Since the CMOS adopts the LDD structure, the contact holes are punched through the inter-layer insulation film 12 and the source electrode $23_{NS}$ and the drain electrode $23_{ND}$ are formed after the side walls 25 are formed on the both side faces of the gate electrode 10.

The impurity concentrations in the N-type source region $26_{NS}'$ and the N-type well-contact region $26_{NCON}'$ are lower than those in the N-type source region $26_{NS}$ and the N-type well-contact region $26_{NCON}$ shown in FIG. 2. Though the side wall 25 does not show a masking effect since the source region $26_{NS}'$ is formed in advance to the side wall formation, the length of the P-type base region 21 in the total channel length can be set longer than that obtained by employing the CMOS process, since the impurity concentration in the N-type source region $26_{NS}'$ can be controlled at the optimum value by the exclusive DMOS process. Therefore, the withstand voltage and the current capacity of the DMOS portion can be increased. And, the P-type base region is formed by employing the process for forming the P-type base region of the bipolar transistor in advance to the formation of the side wall 25, the DMOS structure which includes the N-type source region $26_{NS}'$ and the P-type base region 21 in the P-type well 5 similarly as in the prior art can be obtained even when the side wall 25 is formed in the DMOS portion as well as in the CMOS portion. Therefore, the DMOS portion and the CMOS portion which include the side walls can be integrated into a monolithic circuit.

The N-channel DMOSFET structure shown in FIGS. 2 and 4 which is comprised of the P-type well 5 and the ion-implanted layer 8 may be replaced by an N-channel DMOSFET structure which lacks the P-type well and the ion-implanted layer as shown in FIG. 5. The DMOS portion of FIG. 5 is manufactured through the sequence 3 listed in table 1. AnN-type epitaxial layer 3 is grown over an N+-type buried layer 2 formed on a P-type semiconductor substrate 1, and then, an isolated element island is defined by forming a P+-type element isolation layer 4 which reaches the P-type semiconductor substrate 1. Only an N-type well 6 is then formed in the isolated element island by ion-implantation and subsequent diffusion. The P-type well 5 is not formed. The N-type well 6 constitutes an offset region which functions as an expanded drain for decreasing ON-resistance of the MOSFET. After covering an active region with nitride film and selectively oxidizing the nitride film, an element-isolating insulative film (local oxidation film: LOCOS) 7 is then formed on the element isolation layer 4 and thick local oxidation film 7a on the edge side portion above the N-type well 6. A poly-silicon gate electrode 10 is formed on gate insulation film 9 and the local oxidation film 7a. After forming the gate electrode 10, a P-type base region (channel diffusion region) 21 is formed by employing the base formation process of the bipolar transistor and by ion-implantation using the gate electrode 10 as a mask for self-alignment with respect to a broken line a-b in FIG. 5. After the base region 21 is formed, a side wall 25 is formed on a side face of the gate electrode 10 by depositing oxide film by an exclusive process or by employing a CMOS process for forming an LDD structure described later, and by etching the oxide film by the anisotropic RIE technique. The width LSW of the side wall is from 100 to 500 nm, which is controlled with accuracy of within 10 nm. After the side wall 25 is formed, an N+-type source region 26NS is formed in the P-type base region 21 by employing a CMOS process for forming an N+-type source and a drain described later and by ion-implantation using the side wall 25 as a mask for self-alignment with respect to a broken line c-d in FIG. 5. Simultaneously with the formation of the source region $26_{NS}$, an N+-type well-contact (drain) region $26_{NCON}$ is formed in the N-type well 6. The transverse diffusion length of the N+-type source region $26_{NS}$ and the side wall width LSW should be selected so that the N+-type source region $26_{NS}$ may be positioned below the gate electrode 10. After forming inter-layer insulation film 12, contact holes are punched through the insulation film 12. A source electrode $23_{NS}$ and a drain electrode $23_{ND}$ are then formed. Finally, a passivation film is formed. The thick local oxidation film 7a relaxes convergence of an electric field onto the drain edge and contributes to increasing withstand voltage. Since the thick local oxidation film 7a exists under the side wall on the drain side, the side wall does not affect to the formation of the N+-type drain region $26_{NCON}$. The N+-type drain region $26_{NCON}$ is formed in a portion which is not covered by the thick local oxidation film 7a.

Effective channel length Leff of the MOSFET is expressed by transverse diffusion length LPB of the P-type base region, transverse diffusion length LNS of the N+-type source region $26_{NS}$, and the width LSW of the side wall as follows.

$$L_{eff}=L_{PB}-L_{NS}+L_{SW} \quad (1)$$

Since concentration gradient exists in the surface of the P-type base region 21, the acceptor amount in the offset portion introduced by the side wall formation occupies 80% of the total acceptor amount. For example, in an experimentally manufactured specimen, very short effective channel length $L_{eff}$ of 0.42 µm is obtained by using side wall with width of 120 nm ($L_{SW}$=0.12 µm), and by setting its $L_{PB}$ and $L_{NS}$ at 0.5 µm and 0.2 µm, respectively. Even by this short channel excellent withstand voltage of 74 V is obtained without causing punch-through breakdown, since the total acceptor amount is sufficient.

The effective channel length is extended to from 1 to 3 µm, if high temperature heat treatment is conducted for long period of time in forming the P-type base region 21. Thus, the DMOS structure of FIG. 5 reduces the channel resistance by from 58 to 86% in comparison with the DMOS structure of FIG. 22.

Figure 6:
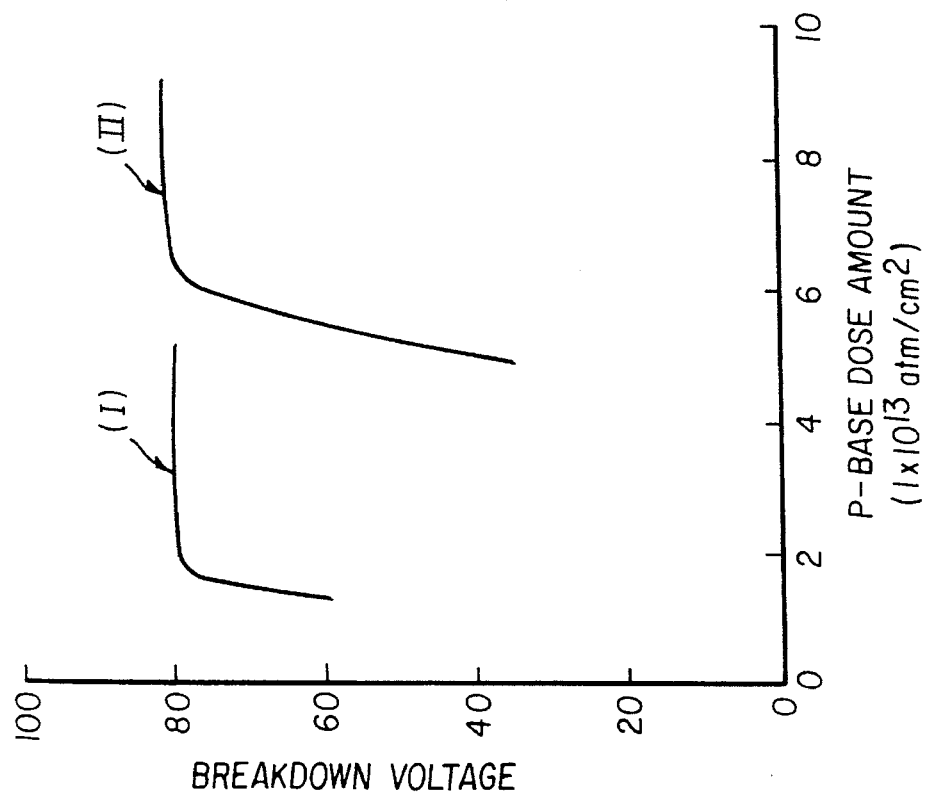
FIG. 6 is a graph showing the numerical simulation result on the relations between dose amount in the P-type base and the breakdown voltage for the DMOSFET (I) shown in FIG. 5 and the DMOSFET (II) the base region of which was not driven by high temperature heat treatment.

FIG. 6 shows the numerical simulation result on the relationship between dose amount in the P-type base and the breakdown voltage (withstand voltage of the device) for the DMOSFET (I) shown in FIG. 5 and the DMOSFET (II) the base region of which was not driven by high temperature heat treatment. The DMOSFETs (I) and (II) were manufactured through the similar process except the side wall formation for the DMOSFET (I). Though an excellent withstand voltage of 80 V is obtained by both DMOSFETs in the high dose amount region, withstand voltage decrease is caused by punching through between the source and the drain as the dose amount decreases. It should be noted that the dose amount for the DMOSFET (I) for obtaining the excellent withstand voltage of 80 V is one-third of that for the DMOSFET (II). That is, the crystal defects in the P-type base region is decreased by self-aligning the N+-type source region $26_{NS}$ using the side wall 25 as a mask.

Figure 7:
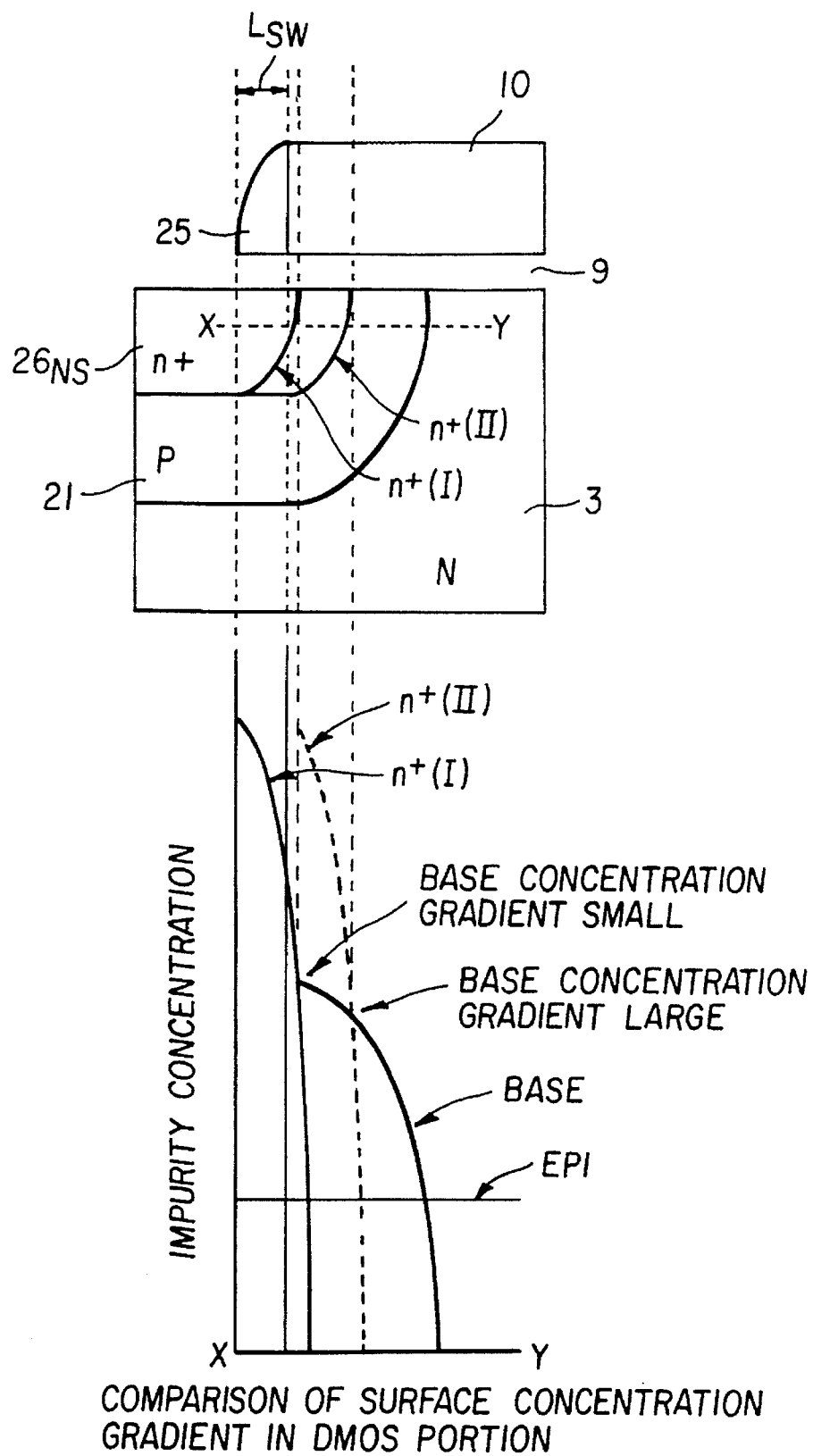
FIG. 7 is a graph comparing the surface concentration gradients of the DMOSFET (I) shown in FIG. 5 and the DMOSFET (II) shown in FIG. 22.

FIG. 7 compares the surface concentration gradients of the DMOSFET (I) shown in FIG. 5 and the DMOSFET (II) shown in FIG. 22, the base region of which was not driven by high temperature heat treatment. As we know from this figure, threshold voltage dispersion caused by process parameter dispersion is reduced, since the maximum surface concentration is confined in the portion of small surface concentration gradient in the P-type base region 21 by forming the N+-type source region 26NS using the side wall 25 as a mask for self-alignment.

Figure 8:
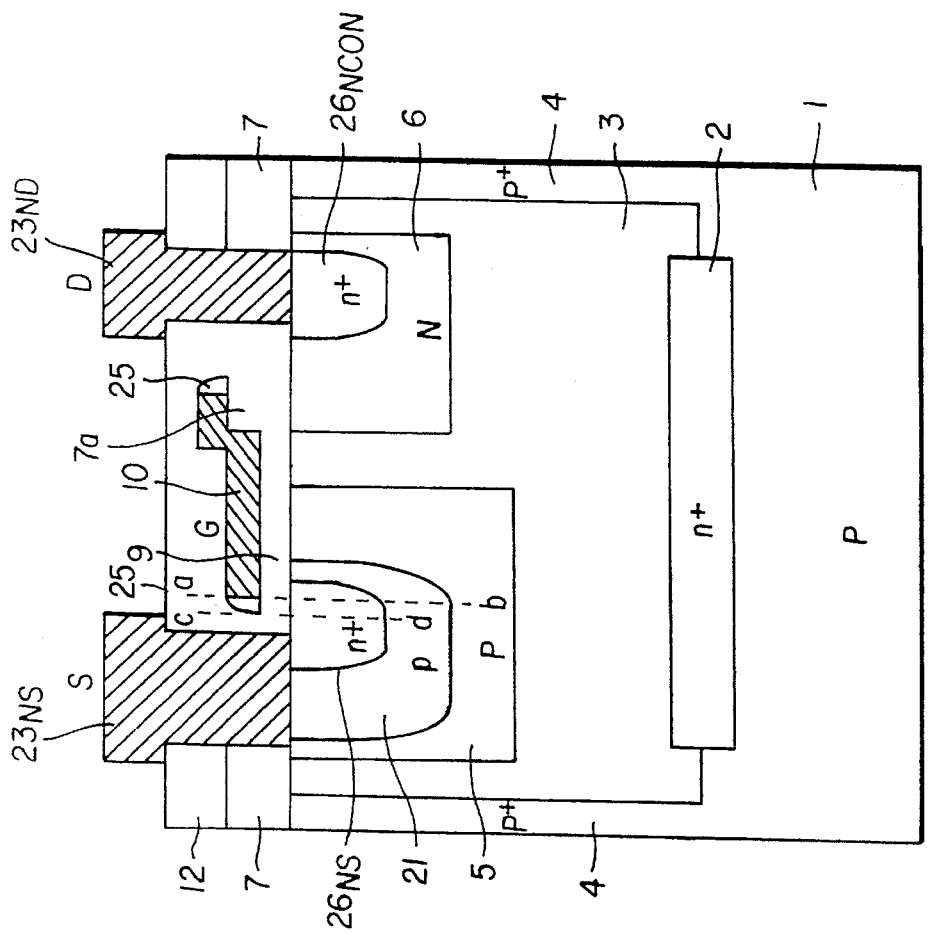
FIG. 8 is a sectional view showing a further different embodiment structure at source and drain electrode formation of the N-channel DMOSFET portion of the high withstand voltage DMOS of the BiCMOS obtained by a further different process according to the present invention.

A DMOSFET structure shown in FIG. 8 does not include the ion-implanted layer 8, though it includes the P-type well as the DMOSFET structure of FIG. 2 does. The DMOS portion of FIG. 8 is manufactured through the sequence 4 of Table 1. An N-type epitaxial layer 3 is grown over an N+-type buried layer 2 formed on a P-type substrate 1, and then, an isolated element island is defined by forming a P+-type element isolation layer 4 which reaches the P-type semiconductor substrate 1. An N-type well 5 and an N-type well 6 are then formed in the isolated element island by ion-implantation and subsequent thermal diffusion. The N-type well 6 constitutes an offset region which functions as an expanded drain for decreasing ON-resistance of the MOSFET. After covering an active region with nitride film and selectively oxidizing the nitride film, element-isolating insulative film (local oxidation film: LOCOS) 7 is formed on the element isolation layer 4 and thick local oxidation film 7a on the P-well side above the N-type well 6. A poly-silicon gate electrode 10 is formed on gate insulation film 9 and the local oxidation film 7a. After forming the gate electrode 10, a P-type base region (channel diffusion region) 21 is formed by employing the base formation process of the bipolar transistor and by ion-implantation using the gate electrode 10 as a mask for self-alignment with respect to a broken line a-b in FIG. 8. After the base region 21 is formed, a side wall 25 is formed on a side face of the gate electrode 10 by depositing oxide film by an exclusive process or by employing a CMOS process for forming an LDD structure described later, and by etching the oxide film by the anisotropic RIE technique. After the side wall 25 is formed, an N+-type source region $26_{NS}$ is formed in the P-type base region 21 by employing a CMOS process for forming an N+-type source and a drain described later and by ion-implantation using the side wall 25 as a mask for self-alignment with respect to a broken line c-d in FIG. 8. Simultaneously with the formation of the source region $26_{NS}$, an N+-type well-contact region (drain) $26_{NCON}$ is formed in the N-type well 6. After forming inter-layer insulation film 12, contact hole are punched through the insulation film 12, and then, a source electrode $23_{NS}$ and a drain electrode $23_{ND}$ are formed. Then, passivation film is formed. This DMOSFET structure improves withstand voltage without so much deteriorating ON-resistance of the DMOSFET, since the P-type base region is diffused deeply and its surface concentration is relatively low.

Figure 9:
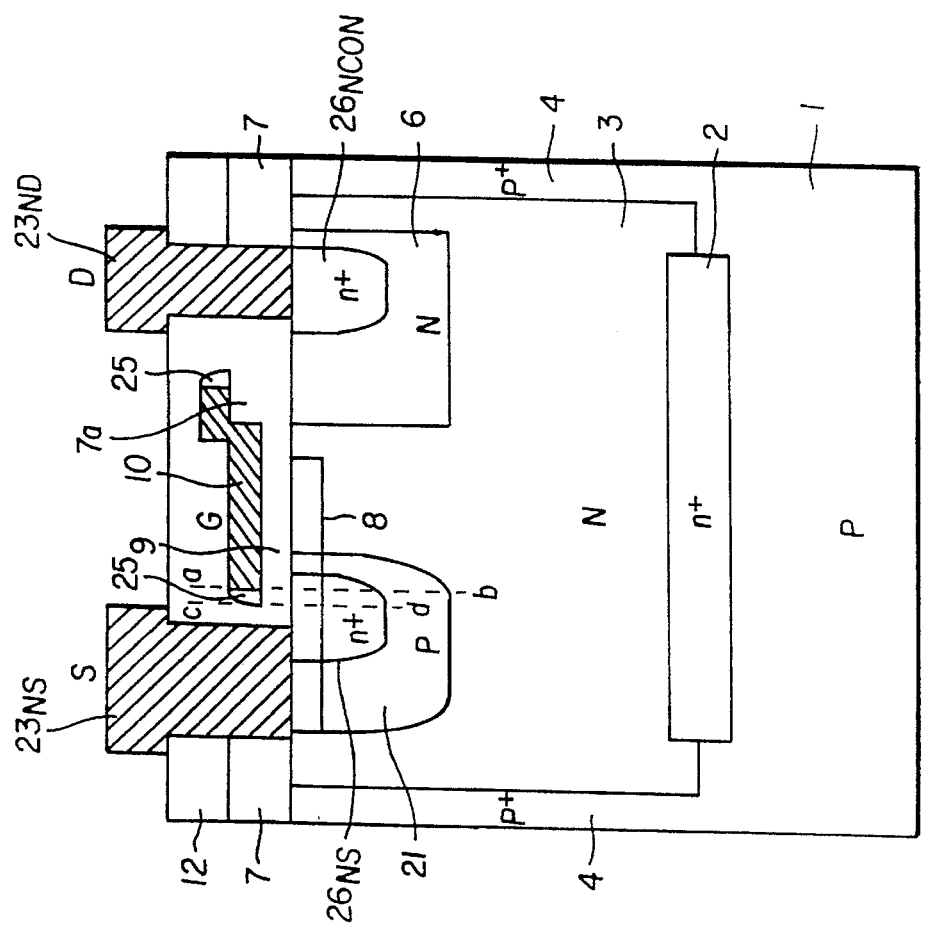
FIG. 9 is a sectional view showing a further more different embodiment structure at source and drain electrode formation of the N-channel DMOSFET portion of the high withstand voltage DMOS of the BiCMOS obtained by a further more different process according to the present invention.

An N-channel DMOSFET structure shown in FIG. 9 includes an ion-implanted later 8, though it does not include the P-type well. The DMOS portion of FIG. 9 is manufactured through the sequence 5 of Table 1. An N-type epitaxial layer 3 is grown over an N+-type buried layer 2 formed on a P-type semiconductor substrate 1, and then, an isolated element island is defined by forming a P+-type element isolation layer 4 which reaches the P-type semiconductor substrate 1. Then, only an N-type well 6 is formed in the isolated element island by ion-implantation and subsequent thermal diffusion. The P-type well is not formed in this DMOSFET structure. The N-type well 6 constitutes an offset region which functions as an expanded drain for decreasing ON-resistance of the MOSFET. After covering an active region with nitride film and selectively oxidizing the nitride film, an element-isolating insulative film (local oxidation film: LOCOS) 7 is formed on the element isolation layer 4 and thick local oxidation film 7a on the edge side portion above the N-type well 6. Then, in this embodiment, ion-implanted layer 8 is formed by implanting the acceptor (P-type) impurities, such as BF2, shallowly by employing the CMOS process. After the ion-implanted layer 8 is formed, a poly-silicon gate electrode 10 is formed on gate insulation film 9 and the local oxidation film 7a. After forming the gate electrode 10, a P-type base region (channel diffusion region) 21 is formed by employing the base formation process of the bipolar transistor and by ion-implantation using the gate electrode 10 as a mask for self-alignment with respect to a broken line a-b in FIG. 9. After the base region 21 is formed, a side wall 25 is formed on a side face of the gate electrode 10 by depositing an oxide film by an exclusive process or by employing a CMOS process for forming an LDD structure described later, and by etching the oxide film by the anisotropic RIE technique. After the side wall 25 is formed, an N+-type source region $26_{NS}$ is formed in the P-type base region 21 by employing a CMOS process for forming an N+-type source and a drain described later and by ion-implantation using the side wall 25 as a mask for self-alignment with respect to a broken line c-d in FIG. 8. Simultaneously with the formation of the source region $26_{NS}$, an N+-type well-contact (drain) region $26_{NCON}$ is formed in the N-type well 6. After forming inter-layer insulation film 12, contact hole are punched through the insulation film 12, and then, a source electrode $23_{NS}$ and a drain electrode $23_{ND}$ are formed. Finally, a passivation film is formed. This DMOSFET structure facilitates controlling the threshold voltage, since the process for forming the ion-implanted layer 8 exists.

Figure 10:
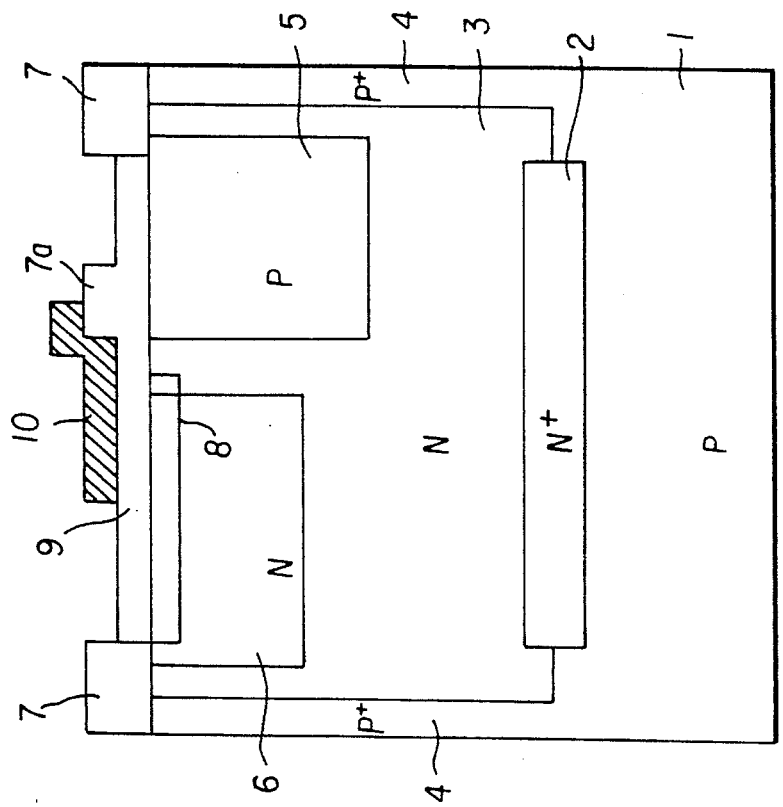
FIG. 10 is a sectional view showing an embodiment structure at gate electrode formation of the P-channel DMOSFET of the high withstand voltage DMOS portion of the BiCMOS according to the present invention.

FIG. 10 is a sectional view showing an embodiment structure at gate electrode formation of the P-channel DMOSFET of the high withstand voltage DMOS portion in the BiCMOS process according to the present invention. In the embodiment of the DMOS portion, as described by the sequence 6 of table 1, an N+-type buried layer 2 is formed on a P-type semiconductor substrate 1. AnN-type epitaxial layer 3 is grown over the buried layer 2, and then, a P+-type element isolation layer 4 which reaches the P-type semiconductor substrate 1 is formed to isolate an element island. A P-type well 5 and an N-type well 6 are formed in the isolated element island by ion-implantation for P- and N wells and subsequent diffusion. The P-type well 5 functions as an offset region which functions as an expanded drain for reducing ON-resistance of the MOSFET. An active region is then covered by a nitride film, and an element-isolating insulative film (local oxidation film: LOCOS) 7 is formed on the P+-type isolation layer 4 and thick local oxidation film 7a is formed on the side of the N-type well above the P-type well 5 by selectively oxidizing the nitride film. An ion-implanted layer 8 is then formed by shallowly implanting impurities of the acceptor type (P type) such as, BF2, from the surface of the P-type well 5. After forming the ion-implanted layer 8, a gate electrode 10 is formed on gate insulation film 9 and the local oxidation film 7a.

Figure 11:
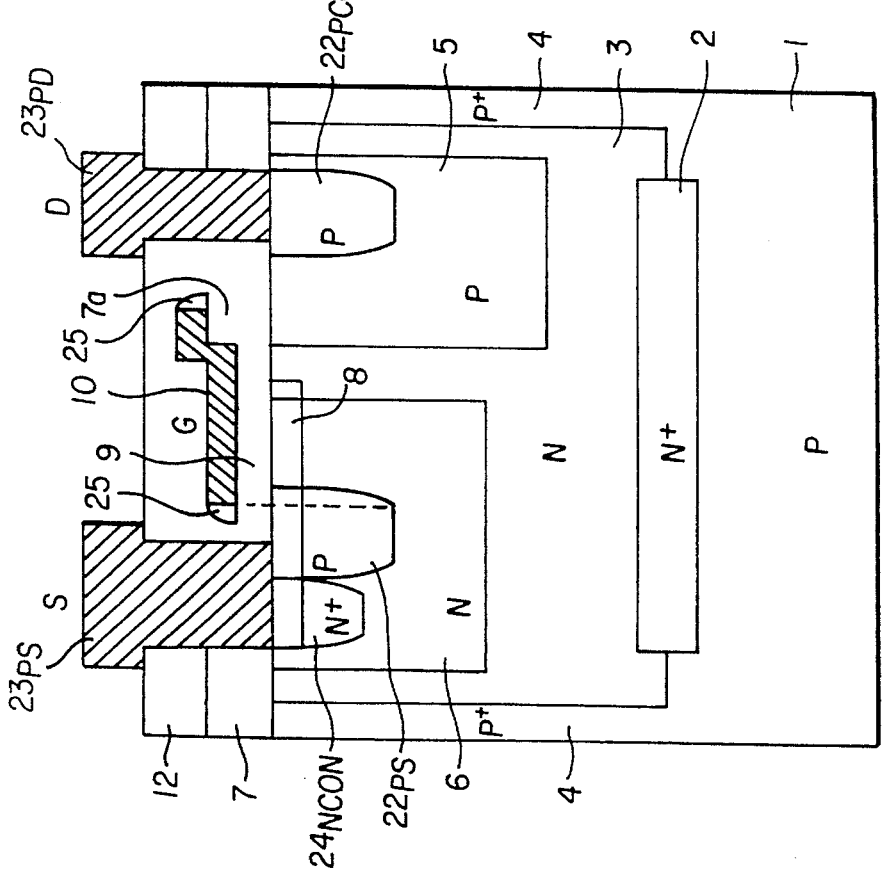
FIG. 11 is a sectional view showing an embodiment structure at source and drain electrode formation of the P-channel DMOSFET of the high withstand voltage DMOS portion in the BiCMOS process according to the present invention.

FIG. 11 is a sectional view showing an embodiment structure at source and drain electrode formation of the P-channel DMOSFET of the high withstand voltage DMOS portion in the BiCMOS process according to the present invention. After the gate electrode 10 is formed, a heavily doped P-type source region $22_{PS}$ is formed in the N-type well 6 by employing a process for forming a P-type base of the bipolar transistor using the gate electrode 10 as a mask for self-alignment. Simultaneously with this process, a P-type well-contact (drain) region $22_{PCON}$ is formed in the P-type well 5. Side walls 25 are then formed on the side faces of the gate electrode 10 so as to conform with a process for forming an LDD structure adopted to the CMOS portion. After the side wall formation, an N+-type well-contact region $24_{NCON}$ is formed in the N-type well 61 by employing the process for forming the N+-type source and drain of the CMOS portion. After forming inter-layer insulation film 12, contact holes are punched through the insulation film 12, and a source electrode $23_{PS}$ and a drain electrode $23_{PD}$ are formed. The thick local oxidation film 7a relaxes electric field convergence onto the drain edge and contributes to increasing withstand voltage.

Thus, the DMOS structure comprised of the N-type well formed underneath the gate and the P-type source region $22_{PS}$ is obtained as by the prior art even when the side walls are formed in the DMOS portion as well as in the CMOS portion, since the P-type source region $22_{PS}$ and the P-type well-contact region (drain) $22_{PCON}$ are formed prior to the formation of the side wall 25. Therefore, the DMOS portion and the CMOS portion which includes the side walls can be integrated into a monolithic circuit.

Figure 12:
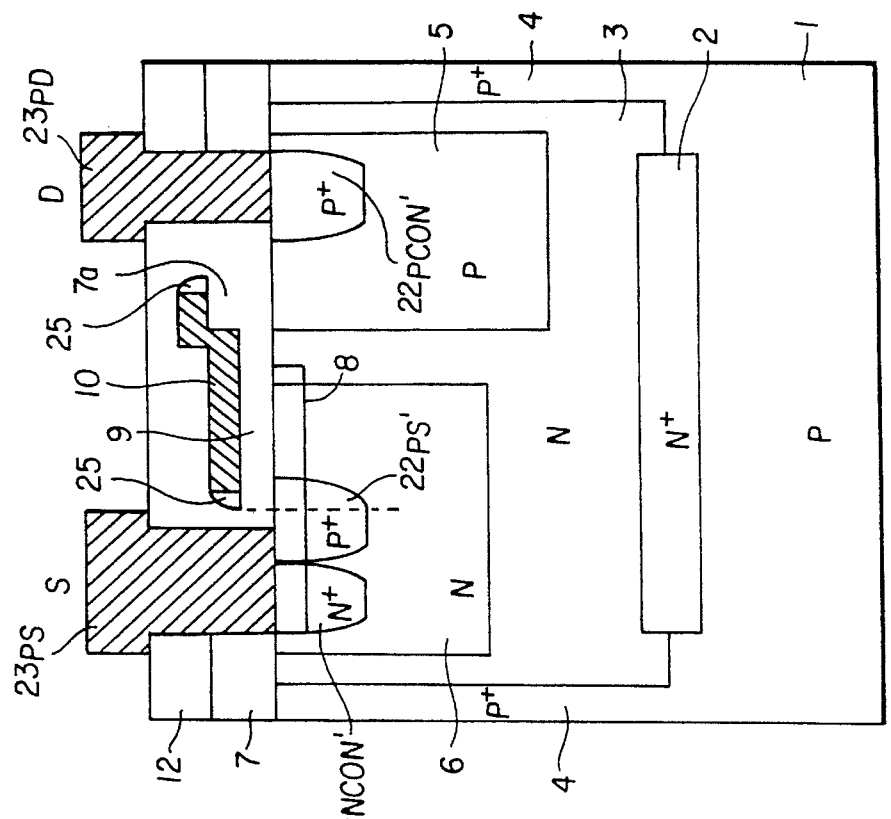
FIG. 12 is a sectional view showing an embodiment structure at source and drain electrode formation of the P-channel DMOSFET of the high withstand voltage DMOS portion of the BiCMOS according to the present invention.

The P-type source region $22_{PS}$ and the P-type well-contact region $22_{PCON}$ of the P-channel DMOSFET transistor shown in FIG. 11 which are formed by employing the process for forming the P-type base region of the bipolar transistor may be replaced by a P-type source region $22_{PS}'$ and a P-type well-contact region $22_{PCON}'$ formed after the formation of the side wall 25 as shown in FIG. 12. That is, after the gate electrode 10 is formed, side walls 25 are formed, as described by the sequence 7 of table 1, for the conformity with the CMOS process for forming the LDD structure. Then, an N-type well-contact region $24_{NCON}'$ is formed in the N-type well 6 by employing a CMOS process for forming an N+-type source and a drain. Then, a P+-type source region $22_{PS}'$ is formed by employing a CMOS process for forming its N+-type source and drain and by using the gate electrode 10 and the side wall 25 as a mask for self-alignment. Simultaneously with the formation of the source region $22_{PS}'$, a P+-type well-contact region $22_{PCON}'$ is formed. After forming inter-layer insulation film 12, contact holes are punched through the insulation film 12, and a source electrode $23_{PS}$ and a drain electrode $23_{PD}$ are then formed. A DMOS structure is obtained which is comprised of the P+-type source region $22_{PS}'$ and the N-type well 6. Transverse diffusion length of the heavily doped P+-type source region $22_{PS}'$ of this DMOS structure is shorter by the side wall length (width) than that of the DMOS structure of FIG. 11, since the P+-type source region $22_{PS}'$ is self-aligned by using the side wall 25 as a mask. Because of this, the DMOS structure of FIG. 12 facilitates suppressing withstand voltage decrease caused by surface punching through as well as increasing current capacity, since the total donner impurity amount in the surface layer of the N-type well underneath the gate electrode can be increased similarly as in the N-channel DMOS shown in FIG. 2.

A P channel DMOS can be fabricated which is similar in structure as the N channel DMOS illustrated in FIG. 5. That is, in place of the P-type base region 21 in FIG. 5, an N-type base region is formed, a P+-type source region is formed in place of the N+-type source region $26_{NS}$, a P-type well is formed in place of the N-type well 6, and P+-type drain region is formed in place of the N+-type drain region $26_{NCON}$. In the manufacturing process of this P-channel DMOS of the embodiment of the present invention, an N-type base region, analogous to the P-type base region 21 of FIG. 5, is formed using the gate electrode 10 as a mask for self-alignment, and a P+-type source region, analogous to N+-type source region $26_{NS}$, is formed using the side wall 25 as a mask for self-alignment.

Figure 13:
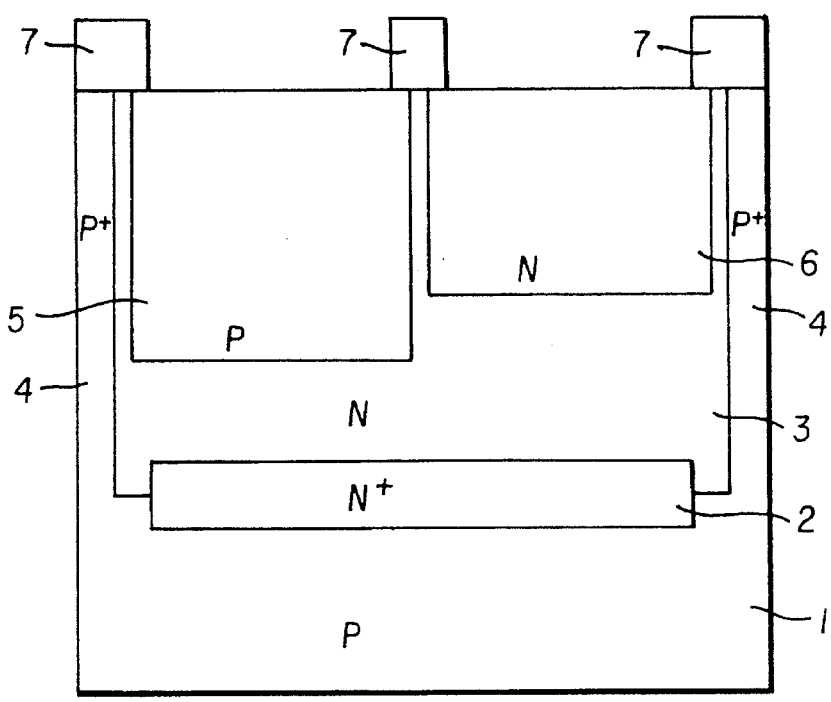
FIG. 13 is a sectional view showing an embodiment structure at local oxidation film formation of the low withstand voltage CMOS portion of the BiCMOS according to the present invention.
Figure 14:
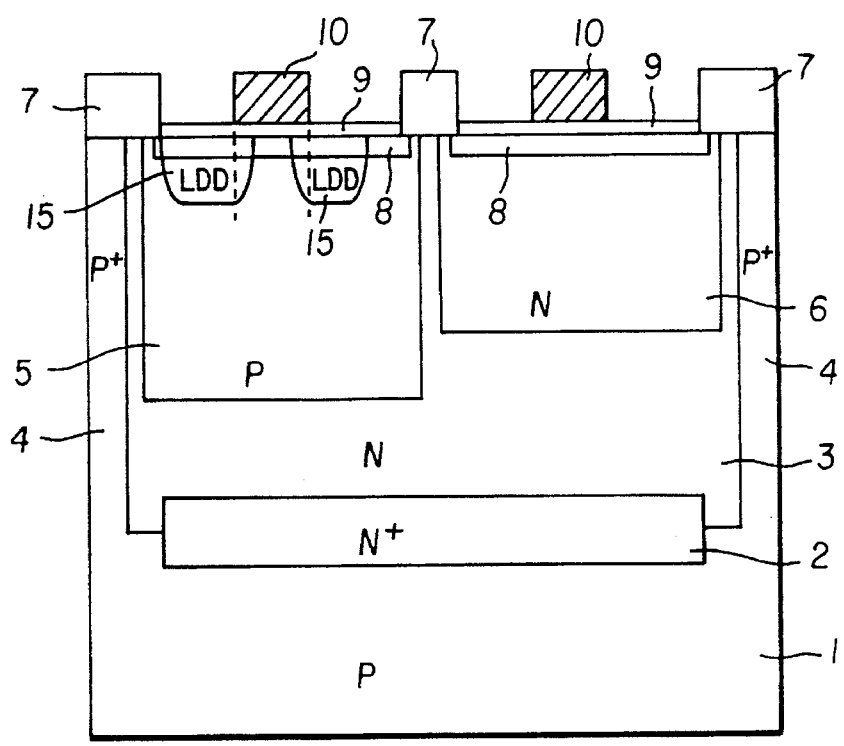
FIG. 14 is a sectional view showing an embodiment structure at LDD structure formation of the low withstand voltage CMOS portion of the BiCMOS according to the present invention.
Figure 15:
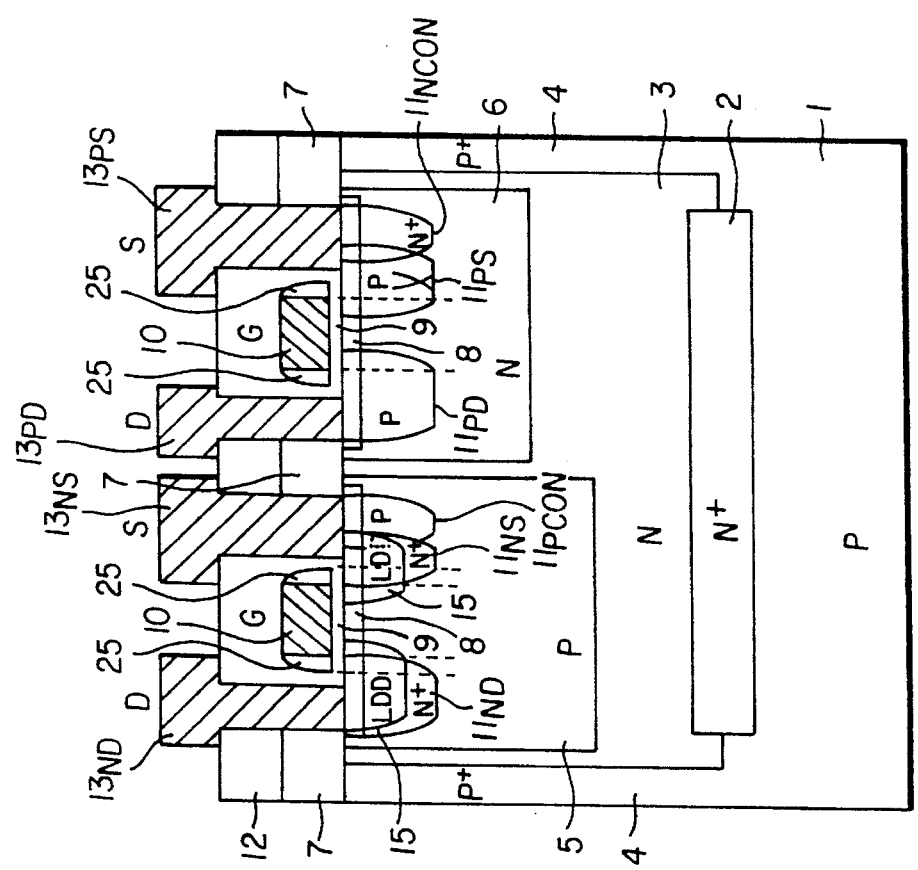
FIG. 15 is a sectional view showing an embodiment structure at source and drain electrode formation of the low withstand voltage CMOS portion of the BiCMOS according to the present invention.

The manufacturing processes for the CMOS portion of the BiCMOS according to the present invention will now be explained with reference to FIGS. from 13 to 16. As described by the sequence 8 of Table 1, in FIG. 13, an N-type epitaxial layer 3 is grown over an N+-type buried layer 2 formed on a P-type semiconductor substrate 1, and an isolated element island is then defined by forming a P+-type element isolation layer 4 which reaches the P-type semiconductor substrate 1. A P-type well 5 and an N-type well 6 are formed in the isolated element island by ion-implantation for P- and N wells and subsequent diffusion. An active region is then covered by a nitride film, and an element-isolating insulative film (local oxidation film: LOCOS) 7 are formed on the P+-type isolation layer 4 and between the wells 5, 6 by selectively oxidizing the nitride film. Then, as shown in FIG. 14, ion-implanted layers 8 are formed by shallowly implanting impurities of the acceptor type (P type) such as, $BF_2$ from the surface of the P-type well 5 and the N-type well 6. After forming the ion-implanted layers, gate electrodes 10 are formed on gate insulation film 9 on the P-type well 5 and the N-type well 6. Lightly doped N-type regions (LDD: lightly doped drain) 15, 15 are then formed by implanting N-type impurities such as phosphorus using the gate electrode 10 on the P-type well 5 as a mask for self-alignment. Then, as shown in FIG. 15, a P-type well-contact region $11_{PCON}$ is formed in the P-type well 5 by employing a process for forming a P-type base region of the bipolar transistor. At the same time, a P-type source $11_{PS}$ and a P-type drain $11_{PD}$ are formed in the N-type well 6 by a self-alignment technique using the gate electrode 10 on the N-type well 6 as a mask. An oxide film is then deposited, for example by the CVD technique, and side walls 25 are formed on the side faces of the gate electrodes 10. An N-type source region $11_{NS}$ and an N-type drain region $11_{ND}$ are then formed in the P-type well 5 by a self-alignment technique using the side wall 25 and the gate electrode 10 as a mask. At the same time, N-type well-contact region $11_{NCON}$ is formed in the N-type well 6. After forming inter-layer insulation film 12, contact holes are punched through the insulation film 12, and source electrodes $13_{PS}$, $13_{NS}$ and drain electrodes $13_{PD}$, $13_{ND}$ are formed. Thus, by constructing the N-channel MOSFET of the DMOS portion in an LDD structure, an electric field in the drain is relaxed, hot carrier injection into the gate insulation film 9 is greatly suppressed, and reliability of the N-channel MOSFET is improved by preventing the gate insulation film 9 from deteriorating with elapse of time.

Figure 16:
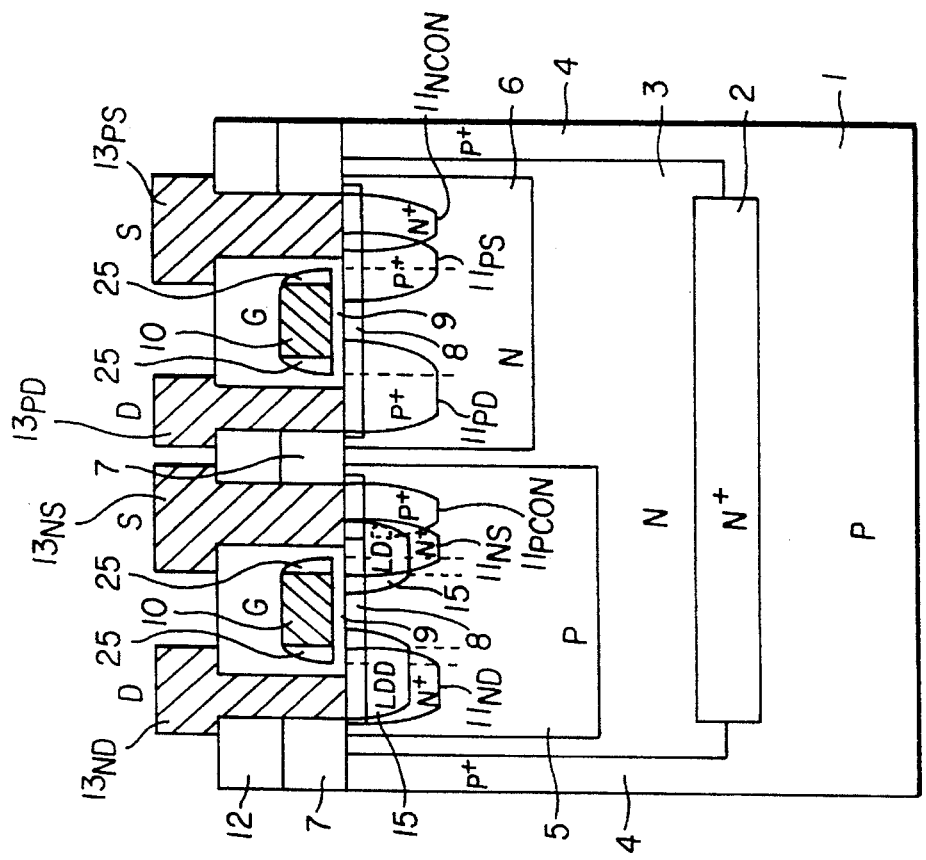
FIG. 16 is a sectional view showing another embodiment structure at source and drain formation of the low withstand voltage CMOS portion of the BiCMOS according to the present invention.

A process for forming exclusively the P-type source and drain of the CMOS portion is eliminated from the above described processes for forming the LDD structure, which forms the P-type well-contact region $11_{PCON}$ in the P-type well 5 by employing the process for forming the P-type base region of the bipolar transistor and self-aligns the P-type source $11_{PS}$ and the P-type drain $11_{PD}$ in the N-type well 6 by using its gate electrode 10 as a mask. Thus, a processing step decrease is realized even in constructing the LDD structure. The P-type well-contact region $11_{PCON}$, the P-type source region $11_{PS}$, and the P-type drain region $11_{PD}$ may be formed by employing the process for forming the P-type source and the drain of the CMOS portion as the sequence 9 of table 1 describes. That is, as shown in FIG. 16, lightly doped N-type regions 15 are self-aligned by implanting N-type impurities such as phosphorus using the gate electrode 10 on the P-type well 5 as a mask, and then, side walls 25 are formed on the side faces of the gate electrodes 10. An N+-type source $11_{NS}$ and an N+-type drain $11_{ND}$ are then self-aligned in the P-type well 5 by using the side wall 25 and the gate electrode 10 as a mask. At the same time, N+-type well-contact region $11_{NCON}$ is formed in the N-type well 6. A P+-type well-contact region $11_{PCON}$, a P+-type source region $11_{PS}$, and a P+-type drain region $11_{PD}$ are then formed by employing the process for forming the P-type source and the drain of the CMOS portion. Even by the manufacturing method of the prior art, hot carrier injection into the gate insulation film 9 is greatly suppressed, and reliability of the N-channel MOSFET is improved.

Figure 17:
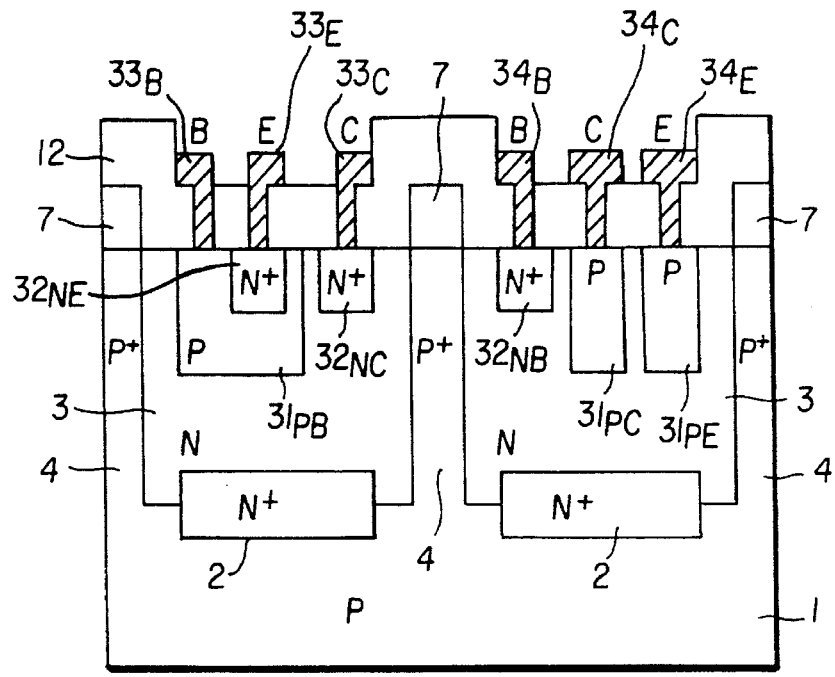
FIG. 17 is a sectional view showing an embodiment structure at electrode formation of the bipolar transistor of the BiCMOS according to the present invention.
Figure 18:
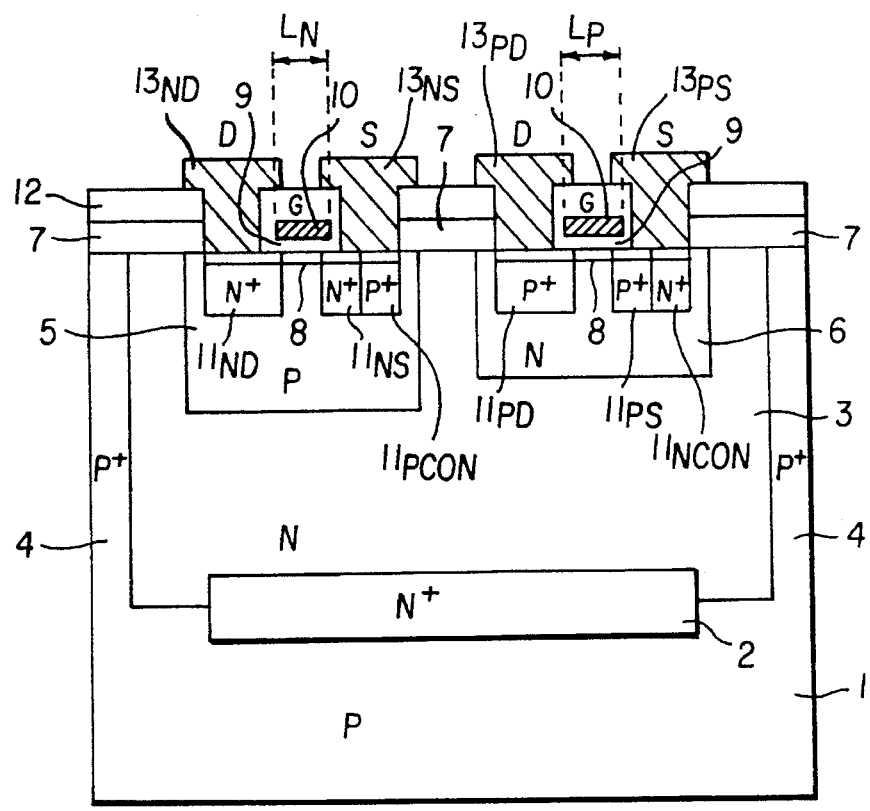
FIG. 18 is a sectional view showing a structure at source and drain electrode formation of the low withstand voltage CMOS portion of the BiCMOS according to the prior art.
Figure 20:
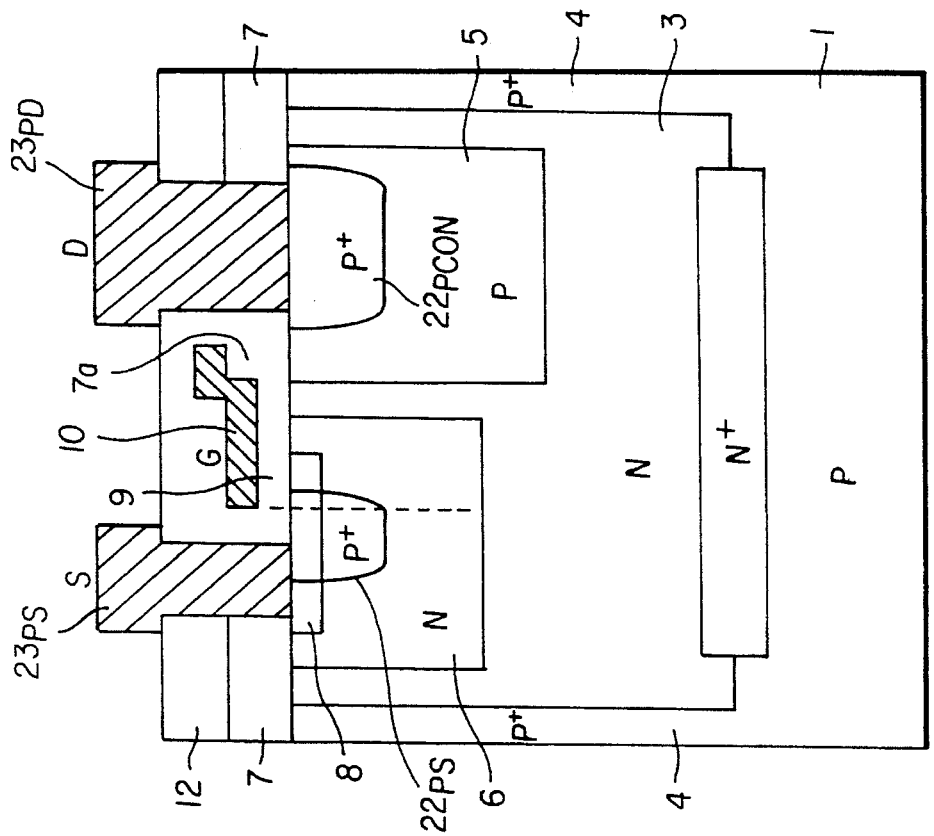
FIG. 20 is a sectional view showing a structure at source and drain electrode formation of the P-channel DMOSFET of the high withstand voltage DMOS portion of the BiCMOS according to the prior art.

Finally, manufacturing processes for the bipolar transistor of the BiCMOS according to the present invention will be explained. The bipolar transistor is comprised of a vertical NPN transistor and a transverse PNP transistor as shown in FIG. 17. By the similar processes as those for the CMOS portion, an N-type epitaxial layer 3 is grown over an N+-type buried layer 2 formed on a P-type substrate 1, and an isolated element island is defined by forming a P+-type element isolation layer 4 which reaches the P-type semiconductor substrate 1. In manufacturing the vertical NPN transistor, as the sequence 10 of table 1 describes, a P-type base region $31_{PB}$ is formed in the epitaxial layer 3. An N+-type emitter region $31_{NE}$ and an N+-type collector region $32_{NC}$ are formed by employing the process for forming the N+-type source and the drain of the CMOS portion. After forming inter-layer insulation film 12, contact holes are then punched through the insulation film 12, and a base electrode $33_B$, an emitter electrode $33_E$ and a collector electrode $33_C$ are formed. In manufacturing the transverse PNP transistor, as the sequence 11 of Table 1 describes, an N+-type base region $32_{NB}$ is formed by employing the process for forming the N+-type source and the drain of the CMOS portion, after forming in the epitaxial layer 3 a P-type emitter region $31_{PE}$ and a P-type collector region $31_{PB}$ by employing the process for forming the P-type base region $31_{PE}$ of the vertical transistor. After forming the inter-layer insulation film 12, contact holes are punched through the insulation film 12, and a base electrode $34_B$, an emitter electrode $34_E$ and a collector electrode $34_C$ are formed. Though the process for forming the N+-type source and the drain of the CMOS portion is employed in the same way as in the prior art, the process for forming the N-type source and the drain of the DMOS portion may be employed for forming the N+-type emitter region $32_{NE}$ and the N+-type collector region $32_{NC}$ of the NPN transistor as the sequence 12 of table 1 describes. The process for forming the P-type base and drain of the CMOS portion can be employed for forming the P-type emitter region $31_{PE}$ and the P-type collector region $31_{PC}$ of the NPN transistor as described by the sequences 13 and 14 of Table 1. The process for forming the N-type source and drain of the DMOS portion can be employed for forming the N+-type base region (base-contact region) $32_{NB}$ of the PNP transistor as described by the sequence 15 of table 1.

Though the embodiments of present invention are explained with reference to the junction separation scheme which separates the elements by the P+-type element isolation layer 4 after growing the epitaxial layer over the P-type semiconductor substrate 1, the present invention is applicable also to the self-separation scheme which separates the elements by a P-type or an N-type semiconductor substrate.

As described above, the present invention, which forms a side wall on a side face of the gate electrode and utilizes the side wall as a mask for self-aligning the source region of the DMOS portion of the BiCMOS semiconductor apparatus for securing the transverse diffusion length difference in the DMOS portion, affords following effects.

(1) The transverse diffusion length of the source region is shortened by the side wall width and the effective channel length is elongated by the side wall width. Because of this, the withstand voltage is improved, since the considerable portion of the total impurity amount in the base region remains in the channel portion as its total impurity amount.

By eliminating the high temperature heat treatment for driving the base region of the second conduction type, the effective channel length can successfully be shortened by compensating the channel length elongation by the side wall with the channel length decrease by the elimination of high temperature heat treatment. By this, the channel resistance is decreased and the current capacity is increased. Thus, the problem of the trade-off relation between the withstand voltage and the current capacity has been solved.

(2) Since the high temperature heat treatment for driving the base region of the second conduction type can be eliminated, the number of processing steps is decreased and impurity diffusion from the gate electrode is prevented, by which reliability of the gate insulation film is improved and the threshold voltage is stabilized. In addition, since the dose amount of the impurities in the P-type base region can be decreased, crystal defects are decreased, which results in improved reliability. Moreover, dispersion of the surface concentration of the P-type base region is decreased and dispersion of the threshold voltage is suppressed.

(3) When the semiconductor apparatus is a BiCMOS semiconductor apparatus, the number of processing steps is decreased by adopting the LDD structure for the CMOS portion and by employing the side wall formation process of the CMOS transistor for forming the side wall in the DMOS portion. Further, the CMOS portion and the DMOS portion can be integrated into a monolithic circuit, and in addition, reliability of the constituent devices is improved since hot carrier injection into the gate insulation film in the CMOS portion can be suppressed.

(4) In addition, to decrease of the processing steps by the employment of the process of base region formation in the bipolar transistor for forming the base region of the second conduction type of the DMOS portion, the impurity concentration in the base region of the DMOS portion can be lowered and the current amplification factor hFE of the bipolar transistor can be increased, since the masking side wall prevents transverse diffusion of the source region of the first conduction type from eroding the base region of the second conduction type.

(5) Moreover, the number of processing steps is further decreased by employing the formation process of the source and the drain of the first or the second conduction type of the CMOS transistor for forming the source region of the first or the second conduction type of the DMOS transistor.

What is claimed is:

1. A manufacturing method for a semiconductor device, including a DMOS transistor with a channel of a first conduction type, comprising steps of:

forming a gate electrode-on gate insulation film deposited on a major face of a semiconductor region of the first conduction type located in a semiconductor substrate;

forming a base region of a second conduction type extending from said major face of said semiconductor region of the first conduction type and into said semiconductor region of the first conduction type by using said gate electrode as a mask for self-alignment; and forming a source region of the first conduction type extending from a major face of said base region of the second conduction type and into said base region of the second conduction type, said step of forming a source region further comprising a step of self-aligning said source region of the first conduction type by using a side wall formed only on a side face of said gate electrode as a mask.

2. The method as claimed in claim 1, wherein said base region of the second conduction type is formed by employing a process for forming a base region of the second conduction type of a bipolar transistor.

3. The method as claimed in claim 2, wherein said source region of the first conduction type is formed by employing a process for forming a source and a drain of the first conduction type of a CMOS transistor.

4. The method as claimed an claim 1, wherein said source region of the first conduction type is formed by employing a process for forming a source and a drain of the first conduction type of a CMOS transistor.

5. The method as claimed in claim 1, further comprising the steps of:

forming a CMOS transistor in the semiconductor substrate by forming a gate electrode on gate insulation film deposited on a major face of the semiconductor region of the first conduction type, forming a LDD structure using said gate electrode as a mask, and forming a source region by masking said LDD structure with side walls only on both sides of said gate electrode; and forming a bipolar transistor in said semiconductor substrate.

6. A manufacturing method for a semiconductor device, including a DMOS transistor with a channel of a first conduction type, comprising steps of:

forming a well of a second conduction type in a semiconductor region of the first conduction type located in a semiconductor substrate;

forming a gate electrode on gate insulation film deposited on a major face of said well of the second conduction type;

forming a base region of the second conduction type extending from said major face of said well of the second conduction type and into said well of the second conduction type by using said gate electrode as a mask for self-alignment; and forming a source region of the first conduction type extending from a major face of said base region of the second conduction type and into said base region of the second conduction type, said step of forming a source region further comprising a step of self-aligning said source region of the first conduction type by using a side wall formed only on a side face of said gate electrode as a mask.

7. The method as claimed in claim 6, wherein said base region of the second conduction type is formed by employing a process for forming a base region of the second conduction type of a bipolar transistor.

8. The method as claimed in claim 7, wherein said source region of the first conduction type is formed by employing a process for forming a source and a drain of the first conduction type of a CMOS transistor.

9. The method as claimed in claim 6, wherein said source region of the first conduction type is formed by employing a process for forming a source and a drain of the first conduction type of a CMOS transistor.

10. The method as claimed in claim 6, further comprising the steps of:

forming a CMOS transistor in the semiconductor substrate by forming a gate electrode on gate insulation film deposited on a major face of said well of the second conduction type, forming a LDD structure using said gate electrode as a mask, and forming a source region by masking said LDD structure with side walls only on both sides of said gate electrode; and forming a bipolar transistor in said semiconductor substrate.

11. A manufacturing method for a semiconductor device, including a DMOS transistor with a channel of a first conduction type, comprising steps of:

forming an ion-implanted layer of a second conduction type extending from a major face of, and into, a semiconductor region of the first conduction type, said semiconductor region of the first conduction type being located in a semiconductor substrate;

forming a gate electrode on gate insulation film deposited on a major face of said ion-implanted layer of the second conduction type;

forming a base region of the second conduction type more deeply than diffusion depth of said ion-implanted layer of the second conduction type by using said gate electrode as a mask for self-alignment; and forming a source region of the first conduction type extending from a major face of, and into, said base region of the second conduction type, said step of forming a source region further comprising a step of self-aligning said source region of the first conduction type by using a side wall formed only on a side face of said gate electrode as a mask.

12. The method as claimed in claim 11, wherein said base region of the second conduction type is formed by employing a process for forming a base region of the second conduction type of a bipolar transistor.

13. The method as claimed in claim 12, wherein said source region of the first conduction type is formed by employing a process for forming a source and a drain of the first conduction type of a CMOS transistor.

14. The method as claimed in claim 11, wherein said source region of the first conduction type is formed by employing a process for forming a source and a drain of the first conduction type of a CMOS transistor.

15. The method as claimed in claim 11, further comprising the steps of:

forming a CMOS transistor in the semiconductor substrate by forming a gate electrode on gate insulation film deposited on a major face of said ion-implanted layer of the second conduction type, forming a LDD structure using said gate electrode as a mask, and forming a source region by masking said LDD structure with side walls only on both sides of said gate electrode; and forming a bipolar transistor in said semiconductor substrate.

16. A manufacturing method for a semiconductor device, including a DMOS transistor with a channel of a first conduction type, comprising steps of:

forming a well of a second conduction type in a semiconductor region of the first conduction type located in a semiconductor substrate;

forming an ion-implanted layer by ion-implanting impurities of the second conduction type into said well of the second conduction type;

forming a gate electrode on gate insulation film deposited on a major face of said well of the second conduction type;

forming a base region of the second conduction type more deeply than diffusion depth of said ion-implanted layer of the second conduction type by using said gate electrode are a mask for self-alignment; and forming a source region of the first conduction type extending from a major face of, and into, said base region of the second conduction type, said step of forming a source region further comprising a step of self-aligning said source region of the first conduction type by using a side wall formed only on a side face of said gate electrode as a mask.

17. The method as claimed in claim 16, wherein said base region of the second conduction type is formed by employing a process for forming a base region of the second conduction type of a bipolar transistor.

18. The method as claimed in claim 17, wherein said source region of the first conduction type is formed by employing a process for forming a source and a drain of the first conduction type of a CMOS transistor.

19. The method as claimed in claim 16, wherein said source region of the first conduction type as formed by employing a process for forming a source and a drain of the first conduction type of a CMOS transistor.

20. The method as claimed in claim 16, further comprising the steps of:

forming a CMOS transistor in the semiconductor substrate by forming a gate electrode on gate insulation film deposited on a major face of said well of the second conduction type, forming a LDD structure using said gate electrode as a mask, and forming a source region by masking said LDD structure with side walls only on both sides of said gate electrode; and forming a bipolar transistor in said semiconductor substrate.

21. A manufacturing method for a semiconductor device, including a DMOS transistor with a channel of a second conduction type, comprising steps of:

forming a well of a first conduction type in a semiconductor region of a first conduction type, said semiconductor region of the first conduction type being located in a semiconductor substrate;

forming an ion-implanted layer by ion-implanting impurities of the second conduction type into a major face of said well of the first conduction type;

forming a gate electrode on gate insulation film deposited on a major face of said ion-implanted layer; and forming a source region of the second conduction type extending from a major face of, and into, said well more deeply than diffusion depth of said ion-implanted layer, said step of forming a source region further comprising a step of self-aligning said source region of the second conduction type by using a side wall formed only on a side face of said gate electrode as a mask.

22. The method as claimed in claim 21, wherein said source region of the second conduction type is formed by employing a process for forming a source and a drain of the second conduction type of a CMOS transistor.

23. The method as claimed in claim 21, further comprising the steps of:

forming a CMOS transistor in the semiconductor substrate by forming a gate electrode on gate insulation film deposited on a major face of said ion-implanted layer, forming a LDD structure using said gate electrode as a mask, and forming a source region by masking said LDD structure with side walls only on both sides of said gate electrode; and forming a bipolar transistor in said semiconductor substrate.

24. A manufacturing method for a semiconductor device, including a DMOS transistor with a channel of a second conduction type, comprising steps of:

forming a gate electrode on gate insulation film deposited on a major face of a semiconductor region of a first conduction type located in a semiconductor substrate;

forming a base region of the first conduction type extending from said major face of, and into, said semiconductor region of the first conduction type by using said gate electrode as a mask for self-alignment; and forming a source region of the second conduction type extending from a major face of, and into, said base region of the first conduction type, said step of forming a source region further comprising a step of self-aligning said source region of the second conduction type by using a side wall formed only on a side face of said gate electrode as a mask.

* * * * *